United States Patent
Tsuchihashi et al.

(10) Patent No.: US 8,906,600 B2
(45) Date of Patent: Dec. 9, 2014

(54) RESIST PATTERN FORMING METHOD, RESIST PATTERN, POSITIVE RESIST COMPOSITION, NANOIMPRINT MOLD AND PHOTOMASK

(75) Inventors: Toru Tsuchihashi, Shizuoka (JP); Michihiro Shibata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/561,540

(22) Filed: Jul. 30, 2012

(65) Prior Publication Data
US 2013/0052568 A1 Feb. 28, 2013

(30) Foreign Application Priority Data
Aug. 22, 2011 (JP) .................................. 2011-180894

(51) Int. Cl.
G03F 7/26 (2006.01)
G03F 1/68 (2012.01)
G03F 7/00 (2006.01)
G03F 7/039 (2006.01)
G03F 7/40 (2006.01)
B82Y 40/00 (2011.01)

(52) U.S. Cl.
CPC ................ G03F 1/68 (2013.01); G03F 7/0002 (2013.01); G03F 7/0392 (2013.01); G03F 7/0397 (2013.01); G03F 7/405 (2013.01); B82Y 40/00 (2013.01)
USPC ........................................ 430/322; 430/270.1

(58) Field of Classification Search
CPC ........... G03F 7/0382; G03F 7/20; G03F 7/30; G03F 7/322; G03F 7/40; H01L 21/0274; H01L 21/28123; H01L 21/312
USPC .............................................. 430/322, 270.1
See application file for complete search history.

(56) References Cited

U.S. PATENT DOCUMENTS

| 4,197,000 A * | 4/1980 | Blackwood .................. 396/625 |
| 5,942,367 A * | 8/1999 | Watanabe et al. ............. 430/170 |
| 6,492,087 B1 | 12/2002 | Brainard |
| 2001/0026895 A1 | 10/2001 | Itoh et al. |
| 2004/0058279 A1 | 3/2004 | Itoh et al. |
| 2006/0172224 A1 | 8/2006 | Cameron et al. |
| 2006/0177763 A1 | 8/2006 | Matsuoka et al. |
| 2009/0035702 A1 | 2/2009 | Matsuoka et al. |

FOREIGN PATENT DOCUMENTS

| JP | 63232430 A | 9/1988 |
| JP | 2000239538 A | 9/2000 |
| JP | 2001-264983 A | 9/2001 |
| JP | 2004-12511 A | 1/2004 |
| JP | 2006146242 A | 6/2006 |
| JP | 2008162101 A | 7/2008 |
| JP | 2010134240 A | 6/2010 |
| JP | 2010-286646 A | 12/2010 |
| WO | 2005023880 A1 | 3/2005 |
| WO | 2010/150917 A1 | 12/2010 |

OTHER PUBLICATIONS

Office Action dated May 21, 2013 issued by the Japanese Patent Office in Japanese Application No. 2011-180894.

* cited by examiner

*Primary Examiner* — Caleen Sullivan
(74) *Attorney, Agent, or Firm* — Sughrue Mion, PLLC

(57) ABSTRACT

A resist pattern forming method includes: in the following order, (1) a step of forming a film on a substrate by using a positive resist composition; (2) a step of exposing the film; and (4) a step of performing development by using an alkali developer after the exposing, wherein the positive resist composition contains (A) a polymer compound having a repeating unit represented by the following formula (I) as defined in the specification, a thickness of the film formed in the step (1) is from 15 to 40 nm, and an alkali component concentration in the alkali developer is from 0.5 to 1.1 mass %.

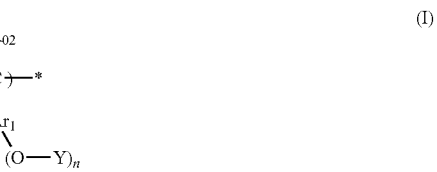

(I)

15 Claims, No Drawings

RESIST PATTERN FORMING METHOD, RESIST PATTERN, POSITIVE RESIST COMPOSITION, NANOIMPRINT MOLD AND PHOTOMASK

BACKGROUND OF THE INVENTION

1. Field of the Invention

The present invention relates to a resist pattern forming method suitably usable in the ultramicrolithography process such as production of VLSI or a high-capacity microchip as well as in other photofabrication processes and capable of forming a highly defined pattern by using an electron beam (EB) or an extreme-ultraviolet ray (EUV), a resist pattern, a positive resist composition, a nanoimprint mold and a photomask. More specifically, the present invention relates to a resist pattern forming method for use in the process where a substrate with a specific underlying film is used, a resist pattern, a positive resist composition, a nanoimprint mold and a photomask.

The resist pattern forming method of the present invention can be also suitably used for the production method of a nanoimprint mold structure.

2. Description of the Related Art

In the microfabrication using a resist composition, with an increase in the integration degree of an integrated circuit, formation of an ultrafine pattern (for example, a 1:1 line-and-space pattern with a line width of 30 nm or less, that is, a repetition of lines of 30 nm or less and spaces of 30 nm or less) is recently required.

To meet this requirement, the exposure wavelength tends to become shorter, such as from g line to i line or further to excimer laser light and at present, development of a lithography technique using an extremely-ultraviolet light (EUV) or an electron beam is proceeding. In recent years, the resist composition is also used for an application to produce a mold for use in the so-called imprint process (for example, JP-A-2008-162101 (the term "JP-A" as used herein means an "unexamined published Japanese patent application") and Yoshihiko Hirai (compiler), Nanoimprint no Kiso to Gijutsu Kaihatsu•Oyo Tenkai—Nanoimprint no Kiban Gijutsu to Saishin no Gijutsu Tenkai (Basic and Technology Development•Application Expansion of Nanoimprint—Base Technology of Nanoimprint and Latest Technology Expansion), Frontier Shuppan (issued on June, 2006)).

Furthermore, the progress in refinement of a pattern formed brings about a new problem of pattern collapse and in order to solve this problem, thinning of the resist film is being applied in combination.

As for the lithography technology using an extreme-ultraviolet light (EUV) or an electron beam or as for the resist composition used for an application to produce an imprint mold, those using a resin in which a hydrogen atom of a phenolic hydroxyl group is replaced by an acid-labile group such as acetal structure are disclosed in JP-A-2000-239538, JP-A-2006-146242 and International Publication No. 05/023880.

An aqueous 2.38 mass % tetramethylammonium hydroxide solution (hereinafter simply referred to as an aqueous TMAH solution) is in fact used as a standard developer in industry, but the above-described thinning of a resist film raises a problem such as disconnection of patterns and LER performance deterioration due to film loss of the resist film during development.

In order to solve this problem, there have been proposed, for example, a method where when developing a positive novolak resist, the pattern is developed with a 0.115 N to 0.15 N alkali developer (JP-A-63-232430), and a method where a resist film formed of a resist composition containing a resin having an ester-type acid-decomposable repeating unit is developed using an aqueous TMAH solution with a concentration of 1.2 mass % or less (JP-A-2010-134240).

SUMMARY OF THE INVENTION

However, for example, the resolution performance for an ultrafine pattern and good nanoedge roughness are not satisfied at present by any of the combinations of a resist composition and the like disclosed.

An object of the present invention is to provide a resist pattern forming method capable of, even in the formation of an ultrafine (for example, a 1:1 line-and-space with a line width of 30 nm or less) pattern, forming a pattern satisfying high sensitivity, high resolution property (for example, high resolution and small line edge roughness (LER)) and excellent pattern profile all at the same time, a resist pattern, a positive resist composition, a nanoimprint mold and a photomask.

As a result of intensive studies, the present inventors have found that when a film with a specific thickness formed using a positive resist composition containing a polymer compound having a specific structure is patternwise exposed and then developed by using an alkali developer having a specific alkali component concentration, the above-described object can be attained.

That is, the present invention is as follows.

[1] A resist pattern forming method, comprising: in the following order, (1) a step of forming a film on a substrate by using a positive resist composition;

(2) a step of exposing the film; and (4) a step of performing development by using an alkali developer after the exposing, wherein the positive resist composition contains (A) a polymer compound having a repeating unit represented by the following formula (I), a thickness of the film formed in the step (1) is from 15 to 40 nm, and an alkali component concentration in the alkali developer is from 0.5 to 1.1 mass %:

wherein each of $R_{01}$, $R_{02}$ and $R_{03}$ independently represents a hydrogen atom, an alkyl group, a cycloalkyl group, a halogen atom, a cyano group or an alkoxycarbonyl group, $R_{03}$ and $Ar_1$ may combine to form a 5- or 6-membered ring and in this case, $R_{03}$ represents an alkylene group;

$Ar_1$ represents an (n+1)-valent aromatic ring group and in the case of combining with $R_{03}$ to form a ring, represents an (n+2)-valent aromatic ring group;

each of n number of Y's independently represents a hydrogen atom or a group capable of leaving by an action of an acid, provided that at least one Y represents a group capable of leaving by an action of an acid; and n represents an integer of 1 to 4.

[2] The resist pattern forming method as described in [1] above,
wherein in the development step (4), the development is performed by continuously supplying a substantially fresh alkali developer.

[3] The resist pattern forming method as described in [1] or [2] above,
wherein the alkali developer used in the development step (4) is an aqueous solution containing tetramethylammonium hydroxide.

[4] The resist pattern forming method as described in any one of [1] to [3] above, further comprising:
(3) a baking step between the exposure step (2) and the development step (4).

[5] The resist pattern forming method as described in any one of [1] to [4] above,
wherein the exposing in the exposure step (2) is performed by an electron beam or EUV light.

[6] The resist pattern forming method as described in any one of [1] to [5] above,
wherein the positive resist composition used in the film forming step (1) further contains (B) a compound capable of generating an acid upon irradiation with an actinic ray or radiation and (C) a basic compound.

[7] A resist pattern, which is formed by the resist pattern forming method as described in any one of [1] to [6] above.

[8] A positive resist composition, which is used for the resist pattern forming method as described in any one of [1] to [6] above.

[9] A nanoimprint mold, which is produced by the resist pattern forming method as described in any one of [1] to [6] above.

[10] A photomask, which is produced by the resist pattern forming method as described in any one of [1] to [6] above.

DETAILED DESCRIPTION OF THE INVENTION

The mode for carrying out the present invention is described in detail below.

Specifically, the resist pattern forming method, the resist pattern, the positive resist composition, the nanoimprint mold and the photomask of the present invention are described in detail.

Incidentally, in the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

In the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

[Resist Pattern Forming Method and Resist Pattern]

First, the use embodiment of the positive resist composition according to the present invention is described.

The resist pattern forming method of the present invention comprises, in order, (1) a step of forming a film on a substrate by using a positive resist composition, (2) a step of exposing the film, and (4) a step of performing development by using an alkali developer after exposure, wherein the positive resist composition contains (A) a polymer compound having a repeating unit represented by formula (I) shown later, the thickness of the film formed in the step (1) is from 15 to 40 nm, and the alkali component concentration in the alkali developer is from 0.5 to 1.1 mass %. (In this specification, mass ratio is equal to weight ratio.)

The positive resist composition according to the present invention is preferably a chemical amplification-type positive resist composition.

Also, the resist pattern of the present invention is formed by the resist pattern forming method of the present invention.

Furthermore, as described later, the present invention also relates to a positive resist composition for use in the resist pattern forming method of the present invention.

The resist pattern forming method of the present invention is described in detail below.

<1> Film Formation

In the present invention, in order to resolve a 1:1 line-and-space pattern with a line width of 30 nm or less, the thickness of the film formed of the positive resist composition must be from 15 to 40 nm. If the film thickness exceeds 40 nm, pattern collapse occurs conspicuously, and a sufficient resolution performance cannot be obtained. Also, if the film thickness is less than 15 nm, good etching resistance cannot be obtained. The film thickness is preferably from 15 to 35 nm. When the film thickness is in this range, excellent etching resistance and resolution performance can be satisfied at the same time.

For obtaining a film of the positive resist composition, the composition is used by dissolving the later-described components in a solvent, filtering the solution through a filter, if desired, and applying it on a support (substrate). The filter is preferably a polytetrafluoroethylene-, polyethylene- or nylon-made filter having a pore size of 0.1 μm or less, more preferably 0.05 μm or less, still more preferably 0.03 μm or less. The coating film is preferably prebaked at 60 to 150° C. for 1 to 20 minutes, more preferably at 80 to 140° C. for 1 to 10 minutes, to form a thin film.

The composition is applied on such a substrate as used in the production of an integrated circuit device (for example, a silicon or silicon dioxide-coated substrate) by an appropriate coating method such as spinner and then dried to form a positive resist composition film.

If desired, various underlying films (inorganic film, organic film) may be coated as an underlayer of the resist composition film.

<2> Exposure

The formed film is irradiated with an actinic ray or radiation through a predetermined mask. Incidentally, in the case of irradiation with an electron beam, lithography not through a mask (direct drawing) is generally performed.

The actinic ray or radiation is not particularly limited but is, for example, KrF excimer laser, ArF excimer laser, EUV light or an electron beam, and EUV light or an electron beam is preferred. That is, the exposure in the step (2) of exposing the film is preferably performed by using an electron beam or EUV light.

<3> Baking

After the exposure, baking (heating) is preferably performed before performing the development. That is, the resist pattern forming method of the present invention preferably further comprises (3) a baking step between the exposure step (2) and the development step (4).

The baking is preferably performed at a heating temperature of 80 to 150° C., more preferably from 90 to 150° C., still more preferably from 100 to 140° C.

The heating time is preferably from 30 to 1,000 seconds, more preferably from 60 to 800 seconds, still more preferably from 60 to 600 seconds.

The heating can be performed by a device attached to a normal exposure/developing machine and may be also performed by using a hot plate or the like.

The reaction in the exposed area is accelerated by the baking, and the sensitivity and pattern profile are improved.

<4> Alkali Development

The alkali component concentration of the alkali developer is from 0.5 to 1.1 mass %. If the alkali component concentration is less than 0.5 mass %, a lot of time is required until the development is completed, and the productivity is seriously reduced. On the other hand, if the alkali component concentration exceeds 1.1 mass %, the resolution performance is impaired due to film loss in the unexposed area of the resist film. The alkali component concentration of the alkali developer is preferably from 0.6 to 1.0 mass %. When an alkali developer having an alkali component concentration in this range is used, the productivity and the resolution performance can be satisfied at the same time.

Examples of the alkali component (hereinafter, sometimes referred to as "alkali species") in the alkali developer used include alkalis such as inorganic alkalis (e.g., sodium hydroxide, potassium hydroxide, ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide (TMAH), tetraethylammonium hydroxide, choline) and cyclic amines (e.g., pyrrole, piperidine). An aqueous solution of such alkalis can be used as the alkali developer.

Furthermore, an aqueous alkali solution obtained by adding an appropriate amount of alcohols such as isopropyl alcohol or a surfactant such as nonionic surfactant (for example, Surfynol 440, 465 (produced by Nissin Chemical Industry Co., Ltd.)) to reduce the surface tension may be also used.

The alcohols or surfactant such as nonionic surfactant may be added in an amount necessary to sufficiently reduce the surface tension of the alkali developer.

The relationship between the amount added of alcohols or surfactant and the surface tension of the aqueous solution varies according to the kind of the compound added and therefore, the amount added cannot be indiscriminately specified, but in the case of adding, for example, isopropyl alcohol, the surface tension of the alkali developer can be reduced to a range of 30 to 50 mN/m by adding the alcohol in an amount of 5 to 20 mass % based on the entire mass of the alkali developer.

The surface tension can be measured by a known method, and examples of the method include a measuring method using Model CBVP-Z manufactured by Kyowa Interface Science Co., Ltd. and a platinum plate.

Among these alkali species in the developers, a quaternary ammonium salt is preferred, and tetramethylammonium hydroxide is more preferred (that is, the alkali developer used in the development step (4) is preferably an aqueous solution containing tetramethylammonium hydroxide).

The content of metal ion in the developer is preferably 10 ppb or less, and the content of halogen ion is preferably 10 ppb or less.

As regards the developing method, for example, a method of dipping the substrate in a bath filled with the developer for a fixed time (dip method), a method of raising the developer on the substrate surface by the effect of a surface tension and keeping still for a fixed time, thereby performing development (puddle method), a method of spraying the developer on the substrate surface (spray method), and a method of continuously ejecting the developer on the substrate spinning at a constant speed while scanning the developer ejecting nozzle at a constant rate (dynamic dispense method) may be applied.

After the step of performing development, a step of stopping the development by replacing the solvent with another solvent may be practiced.

Above all, the developing method is preferably a method of performing development by continuously supplying a substantially fresh alkali developer, and specifically, this is a method of continuously spraying a substantially fresh alkali developer on the substrate surface (spray method), or a method of continuously ejecting a substantially fresh alkali developer on the substrate spinning at a constant speed while scanning the developer ejecting nozzle at a constant rate (dynamic dispense method). By continuously supplying a substantially fresh alkali developer to perform development, the development of the exposed area swiftly proceeds and the resolution performance is enhanced. Also, by continuously supplying a fresh alkali developer to perform development, a development defect attributable to scum generated at the stage of switching from development to rinsing can be reduced.

It is important for the development time to satisfy both the time for sufficiently dissolving the components in the resist composition in the unexposed area and the productivity. The development time varies according to the concentration of alkalis contained in the developer and the alkali solubility of components in the resist composition and cannot be indiscriminately specified.

However, an alkali developer adjusted to an alkalis concentration such that the development time becomes 60 to 600 seconds is preferably used. When the development is performed using an alkali developer adjusted to such a concentration as giving the development time in the range above, balance between the uniformity of pattern size in the substrate plane and the productivity is maintained.

The temperature of the developer is preferably from 0 to 50° C., more preferably from 10 to 30° C.

<5> Rinsing

After the step of performing development, a step of stopping the development while replacing the developer with pure water is preferably practiced.

Also, the pure water can be used by adding alcohols such as isopropyl alcohol or a surfactant such as nonionic surfactant each in an appropriate amount.

The rinsing time is preferably a time long enough to fully wash out the alkali developer on the substrate and usually, the rinsing time is preferably from 5 to 600 seconds, more preferably from 10 to 300 seconds.

The temperature of the rinsing solution is preferably from 0 to 50° C., more preferably 10 to 30° C.

The present invention also relates to a nanoimprint mold and a photomask each produced by the resist pattern forming method of the present invention.

These nanoimprint mold and photomask are preferably produced using a resist-coated mask blank prepared by coating a mask blank with a resist film obtained from the positive resist composition of the present invention.

In the case of forming a resist pattern on a resist-coated mask blank according to the resist pattern forming method of the present invention, the substrate used includes a transparent substrate such as quartz and calcium fluoride. In general, a light-shielding film, an antireflection film, further a phase shift film, and additionally a required functional film such as etching stopper film and etching mask film, are stacked on the substrate. As for the material of the functional film, a film containing silicon or a transition metal such as chromium, molybdenum, zirconium, tantalum, tungsten, titanium and niobium is stacked. Examples of the material used for the outermost surface layer include a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may have a single-layer structure but preferably has a multilayer structure where a plurality of materials are coated one on another. In the case of a multilayer structure, the film thickness per layer is not particularly limited but is preferably from 5 to 100 nm, more preferably from 10 to 80 nm. The thickness of the entire light-shielding film is not particularly limited but is preferably from 5 to 200 nm, more preferably from 10 to 150 nm.

Subsequently, as described above, the resist film above is exposed and then developed to obtain a resist pattern. Using the obtained resist pattern, etching or the like is appropriately performed, whereby a nanoimprint mold or a photomask is produced.

The photomask of the present invention may be a light-transmitting mask used with ArF excimer laser or the like or may be a light reflection-type mask used for reflection lithography employing EUV light as a light source.

Incidentally, the process when preparing an imprint mold by using the composition of the present invention is described, for example, in Japanese Patent 4,109,085, JP-A-2008-162101 and Yoshihiko Hirai (compiler), Nanoimprint no Kiso to Gijutsu Kaihatsu•Oyo Tenkai—Nanoimprint no Kiban Gijutsu to Saishin no Gijutsu Tenkai (Basic and Technology Development•Application Expansion of Nanoimprint—Base Technology of Nanoimprint and Latest Technology Expansion), Frontier Shuppan.

[Positive Resist Composition]

The positive resist composition of the present invention used for the resist pattern forming method of the present invention is described below.

The positive resist composition of the present invention contains (A) a polymer compound having a repeating unit represented by formula (I) shown below.

The positive resist composition of the present invention preferably further contains (B) a compound capable of generating an acid upon irradiation with an actinic ray or radiation and (C) a basic compound.

[1] (A) Polymer Compound

The positive resist composition according to the present invention contains (A) a polymer compound having a repeating unit represented by the following formula (I). In the case of irradiating the composition of the present invention with KrF excimer laser light, electron beam, X-ray or high-energy beam at a wavelength of 50 nm or less (e.g., EUV), the polymer compound (A) preferably contains a hydroxystyrene-based repeating unit. The polymer compound (A) is more preferably a copolymer of a hydroxystyrene and a hydroxystyrene protected by a group capable of leaving by the action of an acid. The hydroxystyrene is preferably p-hydroxystyrene.

The polymer compound (A) containing a repeating unit represented by formula (I) can be synthesized, as described later, by synthesizing a monodisperse polymer by an anionic polymerization process or the like and using the polymer as a precursor. In the case of forming an ultrafine pattern described in the present invention, thanks to use of a monodisperse polymer, the dissolution unit at development becomes uniform, and this makes it easy to maintain the resolution, particularly, small line edge roughness (LER).

In the case where the polymer compound (A) contains a hydroxystyrene repeating unit, the content of the hydroxystyrene repeating unit is preferably from 3 to 90 mol %, more preferably from 5 to 90 mol %, still more preferably from 7 to 85 mol %, based on all repeating units of the polymer compound (A).

(I)

In formula (I), each of $R_{01}$, $R_{02}$ and $R_{03}$ independently represents a hydrogen atom, an alkyl group, a cycloalkyl group, a halogen atom, a cyano group or an alkoxycarbonyl group. $R_{03}$ and $Ar_1$ may combine to form a 5- or 6-membered ring and in this case, $R_{03}$ represents an alkylene group.

$Ar_1$ represents an (n+1)-valent aromatic ring group and in the case of combining with $R_{03}$ to form a ring, represents an (n+2)-valent aromatic ring group.

Each of n number of Y's independently represents a hydrogen atom or a group capable of leaving by the action of an acid, provided that at least one Y represents a group capable of leaving by the action of an acid.

n represents an integer of 1 to 4 and is preferably 1 or 2, more preferably 1.

The alkyl group as $R_{01}$ to $R_{03}$ is, for example, an alkyl group having a carbon number of 20 or less and is preferably a methyl group, an ethyl group, a propyl group, an isopropyl group, an n-butyl group, a sec-butyl group, a hexyl group, a 2-ethylhexyl group, an octyl group or a dodecyl group. The alkyl group is more preferably an alkyl group having a carbon number of 8 or less. These alkyl groups may have a substituent.

As the alkyl group contained in the alkoxycarbonyl group, the preferred alkyl group is the same as that for the alkyl group in $R_{01}$ to $R_{03}$.

The cycloalkyl group may be a monocyclic cycloalkyl group or a polycyclic cycloalkyl group and is preferably a monocyclic cycloalkyl group having a carbon number of 3 to 8, such as cyclopropyl group, cyclopentyl group and cyclohexyl group. These cycloalkyl groups may have a substituent.

The halogen atom includes a fluorine atom, a chlorine atom, a bromine atom and an iodine atom and is preferably a fluorine atom.

In the case where $R_{03}$ represents an alkylene group, the alkylene group is preferably an alkylene group having a carbon number of 1 to 8, such as methylene group, ethylene group, propylene group, butylene group, hexylene group and octylene group.

Each of $R_{01}$, $R_{02}$ and $R_{03}$ independently represents preferably a hydrogen atom or an alkyl group, more preferably a hydrogen atom.

The (n+1)-valent aromatic ring group as $Ar_1$ is preferably an aromatic ring group having a carbon number of 6 to 14, and examples of the divalent aromatic ring group when n is 1 include a phenylene group, a tolylene group and a naphthylene group.

Specific examples of the (n+1)-valent aromatic ring group when n is an integer of 2 or more include groups formed by removing arbitrary (n−1) hydrogen atoms from the above-described specific examples of the divalent aromatic ring group.

These aromatic ring groups may further have a substituent.

Examples of the group Y capable of leaving by the action of an acid include groups represented by $—C(R_{36})(R_{37})(R_{38})$, $—C(=O)—O—C(R_{36})(R_{37})(R_{38})$, $—C(R_1)(R_2)(OR_{39})$, $—C(R_1)(R_2)—C(=O)C(R_{36})(R_{37})(R_{38})$ and $—CH(R_{36})(Ar)$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring structure.

Each of $R_1$ and $R_2$ independently represents a hydrogen atom, an alkyl group, a cycloalkyl group, an aryl group, an aralkyl group or an alkenyl group.

Ar represents an aryl group.

The alkyl group as $R_{36}$ to $R_{39}$, $R_1$ and $R_2$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group as $R_{36}$ to $R_{39}$, $R_1$ and $R_2$ may be a monocyclic cycloalkyl group or a polycyclic cycloalkyl group. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be replaced by a heteroatom such as oxygen atom.

The aryl group as $R_{36}$ to $R_{39}$, $R_1$, $R_2$ and Ar is preferably an aryl group having a carbon number of 6 to 10, and examples thereof include a phenyl group, a naphthyl group and an anthryl group.

The aralkyl group as $R_{36}$ to $R_{39}$, $R_1$ and $R_2$ is preferably an aralkyl group having a carbon number of 7 to 12, and preferred examples thereof include a benzyl group, a phenethyl group and a naphthylmethyl group.

The alkenyl group as $R_{36}$ to $R_{39}$, $R_1$ and $R_2$ is preferably an alkenyl group having a carbon number of 2 to 8, and examples thereof include a vinyl group, an allyl group, a butenyl group and a cyclohexenyl group.

The ring that can be formed by combining $R_{36}$ and $R_{37}$ with each other may be monocyclic or polycyclic. The monocyclic ring structure is preferably a cycloalkane structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring structure is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the ring structure may be replaced by a heteroatom such as oxygen atom.

Each of the groups above may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The substituent preferably has a carbon number of 8 or less.

The group Y capable of leaving by the action of an acid is preferably a structure represented by the following formula (II):

In formula (II), each of $L_1$ and $L_2$ independently represents a hydrogen atom, an alkyl group, a cycloalkyl group, an aryl group or an aralkyl group.

M represents a single bond or a divalent linking group.

Q represents an alkyl group, a cycloalkyl group, an alicyclic group, an aromatic ring group, an amino group, an ammonium group, a mercapto group, a cyano group or an aldehyde group. The alicyclic group and the aromatic ring group may contain a heteroatom.

At least two members of Q, M and $L_1$ may combine with each other to form a 5- or 6-membered ring.

The alkyl group as $L_1$ and $L_2$ is, for example, an alkyl group having a carbon number of 1 to 8, and specific examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific examples thereof include a cyclopentyl group, a cyclohexyl group, a norbornyl group and an adamantyl group.

The aryl group as $L_1$ and $L_2$ is, for example, an aryl group having a carbon number of 6 to 15, and specific examples thereof include a phenyl group, a tolyl group, a naphthyl group and an anthryl group.

The aralkyl group as $L_1$ and $L_2$ is, for example, an aralkyl group having a carbon number of 7 to 20, and specific examples thereof include a benzyl group and a phenethyl group.

Each of $L_1$ and $L_2$ independently represents preferably a hydrogen atom or an alkyl group, and it is more preferred that one of $L_1$ and $L_2$ is a hydrogen atom and the other is an alkyl group.

Examples of the divalent linking group as M include an alkylene group (preferably an alkylene group having a carbon number of 1 to 8, such as methylene group, ethylene group, propylene group, butylene group, hexylene group and octylene group), a cycloalkylene group (preferably a cycloalkylene group having a carbon number of 3 to 15, such as cyclopentylene group and cyclohexylene group), an alkenylene group (preferably an alkenylene group having a carbon number of 2 to 8, such as vinylene group, propenylene group and butenylene group), an arylene group (preferably an arylene group having a carbon number of 6 to 20, such as phenylene group, tolylene group and naphthylene group), —S—, —O—, —CO—, —SO$_2$—, —N(R$_0$)—, and a combination of two or more thereof. Here, R$_0$ is a hydrogen atom or an alkyl group. The alkyl group as R$_0$ is, for example, an alkyl group having a carbon number of 1 to 8, and specific examples thereof include a methyl group, an ethyl group, a propyl group, an n-butyl group, a sec-butyl group, a hexyl group and an octyl group.

M preferably represents a single bond, an alkylene group, —O— or a divalent linking group composed of a combination thereof, more preferably a single bond, an alkylene group or an alkyleneoxy group.

Examples of the alkyl group and cycloalkyl group as Q are the same as those described above for respective groups as L$_1$ and L$_2$.

Examples of the alicyclic group and aromatic ring group as Q include the above-described cycloalkyl group and aryl group as L$_1$ and L$_2$. The cycloalkyl group and aryl group are preferably a group having a carbon number of 3 to 15.

Examples of the heteroatom-containing alicyclic group or aromatic ring group as Q include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring is not limited thereto as long as it is a ring composed of carbon and a heteroatom or a ring composed of only a heteroatom.

Q preferably represents an alkyl group, a cycloalkyl group, an alicyclic group or an aromatic ring group, more preferably an alkyl group, a cycloalkyl group or an aromatic ring group.

Examples of the ring structure which may be formed by combining at least two members out of Q, M and L$_1$ with each other include a 5- or 6-membered ring structure where a propylene group or a butylene group is formed by the members above. The 5- or 6-membered ring structure contains an oxygen atom.

In formula (II), each of the groups represented by L$_1$, L$_2$, M and Q may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. These substituents preferably have a carbon number of 8 or less.

The group represented by -(M-Q) is preferably a group having a carbon number of 1 to 30, more preferably a group having a carbon number of 5 to 20. Particularly, from the standpoint of suppressing outgas, a group having a carbon number of 6 or more is preferred.

The content of the repeating unit represented by formula (I) in the polymer compound (A) of the present invention is preferably from 5 to 50 mol %, more preferably from 10 to 40 mol %, still more preferably from 15 to 40 mol %, based on all repeating units of the polymer compound (A).

The polymer compound (A) may further contain a repeating unit other than the repeating units described above. Such a repeating unit includes, for example, the below-described repeating unit stable to the action of an acid.

Specific examples of the repeating unit stable to the action of an acid include a repeating unit of a styrene derivative having a non-acid-decomposable substituent, such as repeating unit represented by formula (IV), and a repeating unit having a non-acid decomposable aryl structure, a cycloalkyl structure or a lactone structure in the side chain of an acryl structure, such as repeating unit represented by formula (V).

By virtue of having such a structure, the adjustment of contrast and the enhancement of etching resistance can be expected.

(IV)

(V)

In formula (IV), Ra represents a hydrogen atom, an alkyl group, or a —CH$_2$—O-Ra$_2$ group, wherein Ra$_2$ represents a hydrogen atom, an alkyl group or an acyl group. The alkyl group as Ra and Ra$_2$ is preferably an alkyl group having a carbon number of 1 to 8, more preferably a carbon number of 1 to 4. The alkyl group as Ra and Ra$_2$ may further have a substituent, and examples of the substituent include a halogen atom such as fluorine atom and chlorine atom. Examples of the alkyl group of Ra include a methyl group, a chloromethyl group and a trifluoromethyl group.

Ra is preferably a hydrogen atom, a methyl group, a hydroxymethyl group or a trifluoromethyl group, more preferably a hydrogen atom or a methyl group.

In formula (IV), B represents an acyl group, an alkyl group, an alkoxy group, an aryl group, a halogen atom, a cyano group, an acyloxy group or an alkoxycarbonyl group and is preferably an acyloxy group or an alkoxycarbonyl group, more preferably an acyloxy group. Among acyloxy groups (represented by the formula: —O—CO—R$_4$, wherein R$_4$ is an alkyl group), an acyloxy group where the carbon number of R$_4$ is from 1 to 6 is preferred, an acyloxy group where the carbon number of R$_4$ is from 1 to 3 is more preferred, and an acyloxy group where the carbon number of R$_4$ is 1 (that is, an acetoxy group) is still more preferred.

p represents an integer of 0 to 5 and is preferably from 0 to 2, still more preferably 1 or 2, yet still more preferably 1.

Each of the groups above may have a substituent, and preferred examples of the substituent include a hydroxyl group, a carboxyl group, a cyano group, a halogen atom (e.g., fluorine atom, chlorine atom, bromine atom, iodine atom), and an alkoxy group (e.g., methoxy group, ethoxy group, propoxy group, butoxy group). The cyclic structure may further have an alkyl group (preferably having a carbon number of 1 to 8) as the substituent.

Specific examples of the repeating unit represented by formula (IV) are illustrated below, but the present invention is not limited thereto.

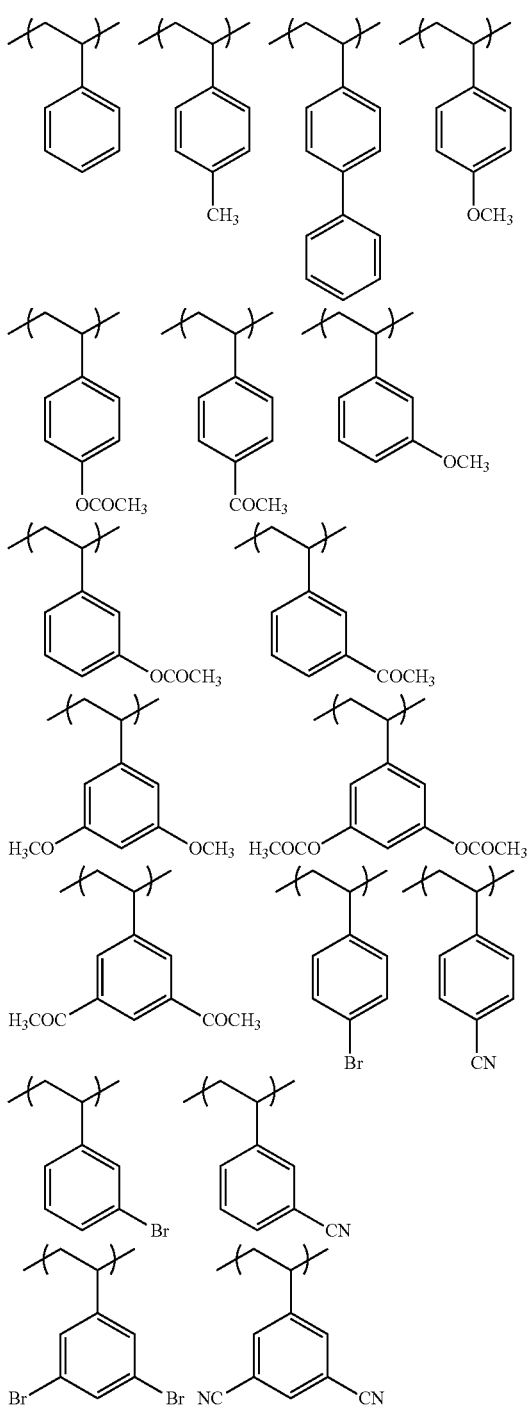

In formula (V), $R_5$ represents a non-acid-decomposable hydrocarbon group or a lactone group.

Ra has the same meaning as Ra in formula (IV), and preferred examples thereof are also the same.

$R_5$ is preferably a hydrocarbon group or lactone group having a cyclic structure. In the case of having a cyclic structure, specific examples include a monocyclic or polycyclic cycloalkyl group (preferably having a carbon number of 3 to 12, more preferably a carbon number of 3 to 7), a monocyclic or polycyclic cycloalkenyl group (preferably having a carbon number of 3 to 12), an aryl group (preferably having a carbon number of 6 to 20, more preferably a carbon number of 6 to 12), an aralkyl group (preferably having a carbon number of 7 to 20, more preferably a carbon number of 7 to 12), and a monocyclic or polycyclic lactone group (preferably having a carbon number of 4 to 15, more preferably a carbon number of 4 to 10).

Each of the groups above may have a substituent, and examples of the substituent include an alkyl group, a cycloalkyl group, an aryl group, an aralkyl group and a halogen atom.

Specific examples of the repeating unit represented by formula (V) are illustrated below, but the present invention is not limited thereto. In the formulae, Ra represents H, $CH_3$, $CH_2OH$ or $CF_3$.

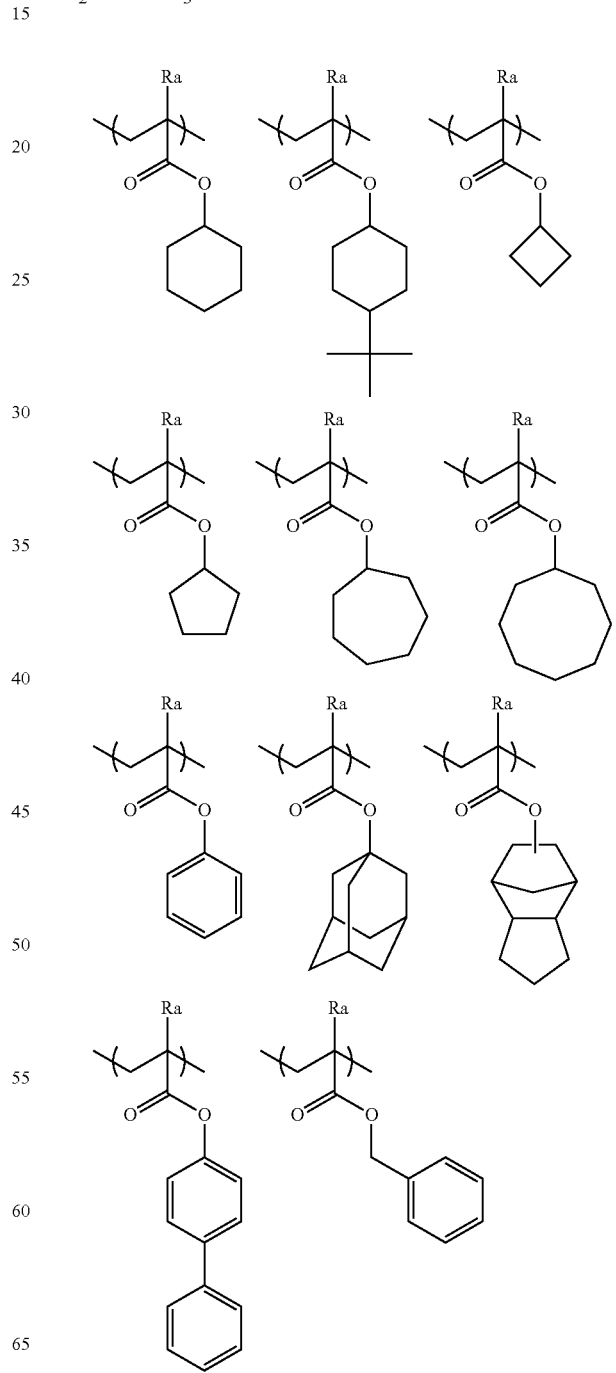

-continued

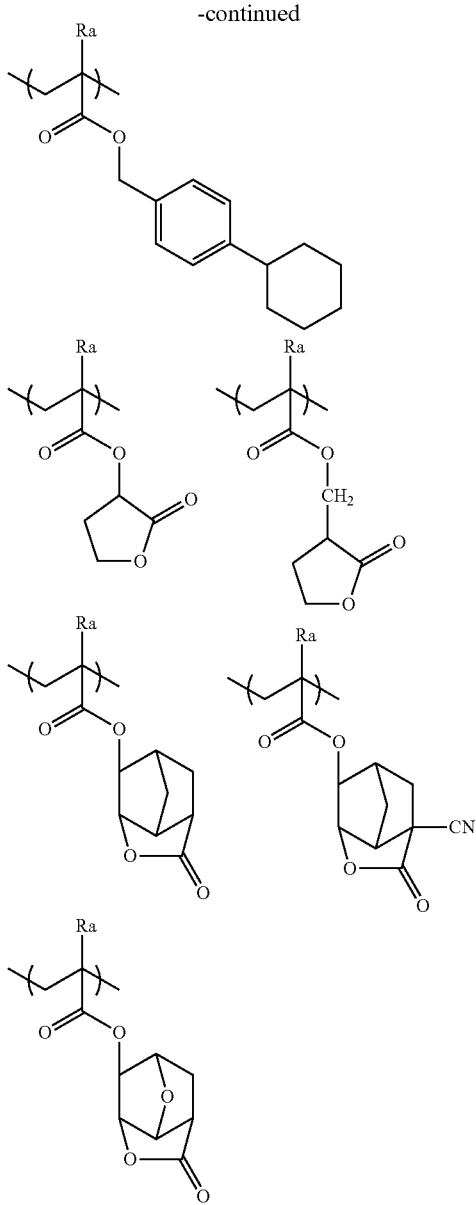

The polymer compound (A) for use in the present invention may or may not contain a repeating unit represented by formula (IV) or (V), but in the case of containing the repeating unit represented by formula (IV) or (V), the content thereof is preferably from 1 to 40 mol %, more preferably from 2 to 20 mol %, based on all repeating units in the polymer compound (A).

The repeating unit stable to the action of an acid is preferably the repeating unit represented by formula (IV). The polymer compound (A) containing a repeating unit represented by formula (IV) together with a repeating unit represented by formula (I) can be synthesized by using, as a precursor, a monodisperse polymer synthesized through a living anionic polymerization process as described later. In the case of forming an ultrafine pattern described in the present invention, thanks to use of a monodisperse polymer, the dissolution unit at development becomes uniform, and this makes it easy to maintain the resolution, particularly, small line edge roughness (LER).

The polymer compound (A) for use in the present invention preferably further contains a repeating unit having, in the side chain, a group capable of generating an acid upon irradiation with an actinic ray or radiation (hereinafter, sometimes referred to as "photoacid generating group"), because the sensitivity is excellent. In this case, the later-described compound (B) capable of generating an acid upon irradiation with an actinic ray or radiation is not an independent compound but is one constituent component in the polymer compound (A) according to the present invention. That is, in one embodiment of the present invention, it is preferred that the polymer compound (A) further contains a repeating unit having, in the side chain, a group capable of generating an acid upon irradiation with an actinic ray or radiation and the polymer compound (A) and the later-described compound (B) are the same compound.

The repeating unit having a photoacid generating group includes, for example, the repeating units described in paragraph [0028] of JP-A-9-325497 and the repeating units described in paragraphs [0038] to [0041] of JP-A-2009-93137. In this case, the repeating unit having a photoacid generating group can be considered to come under the compound (B) capable of generating an acid upon irradiation with an actinic ray or radiation.

The polymer compound (A) for use in the present invention may or may not contain a repeating unit having a photoacid generating group in the side chain, but in the case of containing a repeating unit having a photoacid generating group in the side chain, the content thereof is preferably from 1 to 10 mol %, more preferably from 2 to 8 mol %, based on all repeating units in the polymer compound (A).

In the polymer compound (A) of the present invention, other polymerizable monomers capable of controlling the film formability or solvent solubility may be copolymerized.

Examples of such a polymerizable monomer include, but are not limited to, a hydrogenated hydroxystyrene, a maleic anhydride, an acrylic acid derivative (e.g., acrylic acid, acrylic acid ester), a methacrylic acid derivative (e.g., methacrylic acid, methacrylic acid ester), an N-substituted maleimide, an acrylonitrile and a methacrylonitrile.

In addition, other preferred examples of the repeating unit of the polymer compound include a unit having a cyclic structure in the main chain (such as unit derived from a monomer having an indene structure), a unit having a naphthol structure and a repeating unit having a —$C(CF_3)_2OH$ group.

In the case where the polymer compound (A) contains a repeating unit derived from those polymerizable monomers or the above-described repeating unit, the content of the repeating unit is preferably from 1 to 30 mol %, preferably from 1 to 10 mol %, based on all repeating units in the polymer compound (A).

In the present invention, as for the polymer compound (A), one kind may be used alone, or two or more kinds may be used in combination.

The mass average molecular weight of the polymer compound (A) for use in the present invention is preferably 10,000 or less. The mass average molecular weight is more preferably from 1,000 to 8,000, still more preferably from 2,000 to 6,000.

When the molecular weight of the polymer compound is in the range above, sufficient resolution performance and LER performance can be obtained.

The polydispersity (Mw/Mn) of the polymer compound (A) is preferably from 1.0 to 1.7, more preferably from 1.0 to 1.2.

Here, the weight average molecular weight (Mw) and polydispersity (Mw/Mn) of the polymer compound (A) are determined by GPC (gel permeation chromatography) measurement (solvent: THF) on a polystyrene basis.

The polymer compound (A) can be synthesized by a known radical polymerization or anionic polymerization method. For example, in the radical polymerization method, vinyl monomers are dissolved in an appropriate organic solvent and reacted at room temperature or under heating condition by using a peroxide (e.g., benzoyl peroxide), a nitrile compound (e.g., azobisisobutyronitrile) or a redox compound (e.g., cumene hydroperoxide-ferrous salt) as the initiator, whereby the polymer can be obtained. Also, in the anionic polymerization method, vinyl monomers are dissolved in an appropriate organic solvent and reacted usually under cooling condition by using a metal compound (e.g., butyllithium) as the initiator, whereby the polymer can be obtained.

Also, after polymerizing a polymer by using unsaturated monomers corresponding to precursors of respective repeating units, the synthesized polymer may be modified with a low molecular compound to effect the conversion into desired repeating units so as to synthesize the polymer. In all of these cases, living polymerization such as living anionic polymerization is preferably used, because the obtained polymer compound can have a uniform molecular weight distribution.

Specific examples of the polymer compound described above are illustrated below, but the present invention is not limited thereto.

R-1
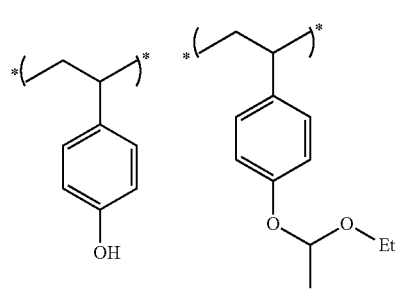

R-2
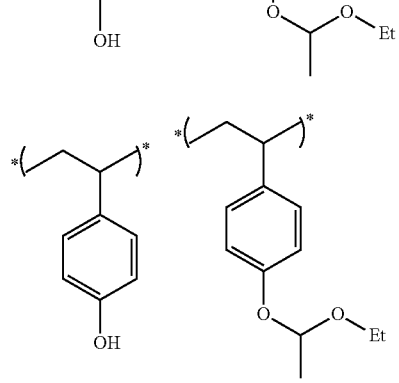

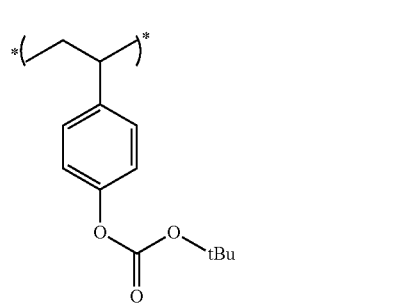

R-3
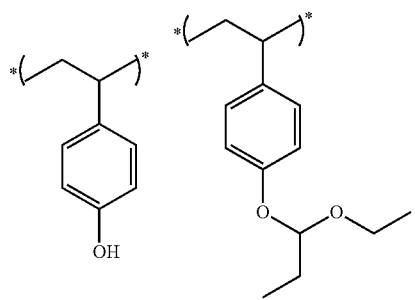

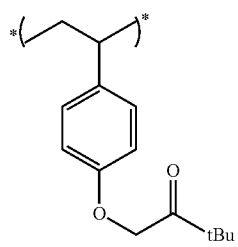

R-4
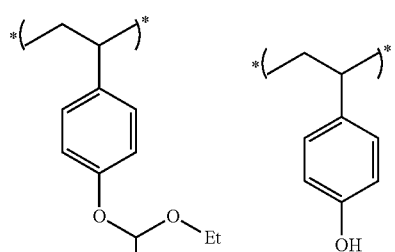

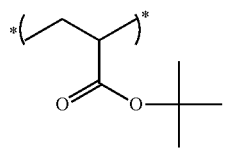

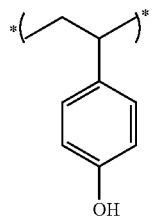

R-5
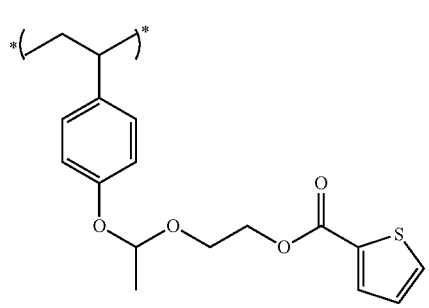

-continued
R-6
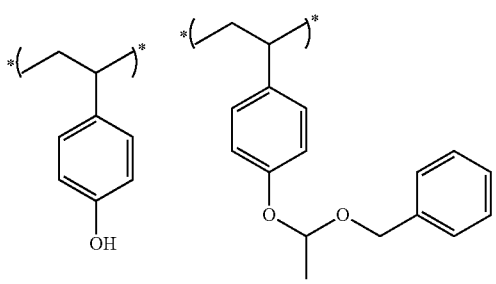
R-7
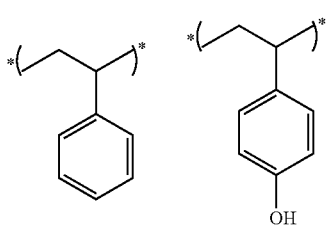
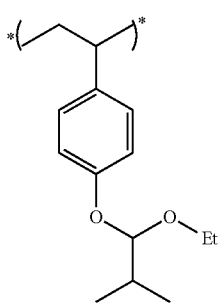
R-8
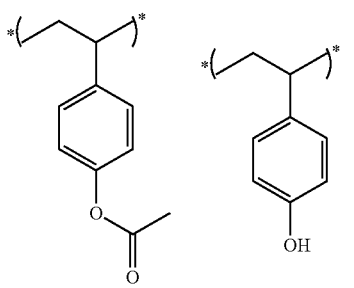
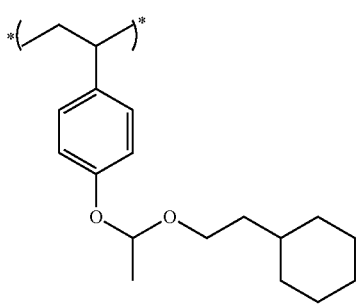
R-9
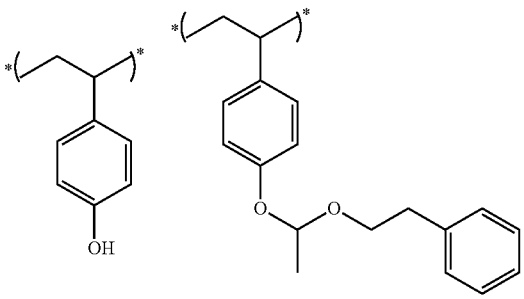
R-10
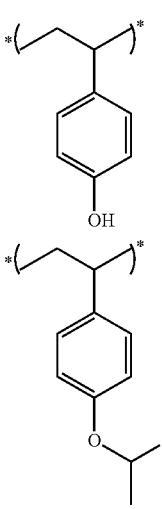
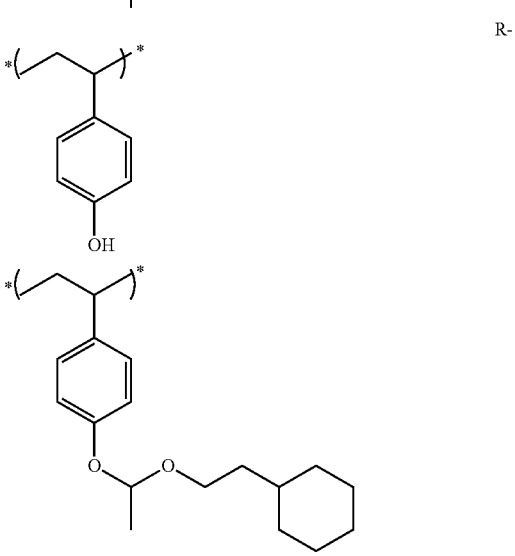
R-11
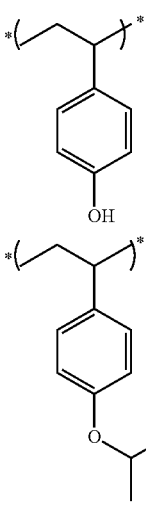
R-12
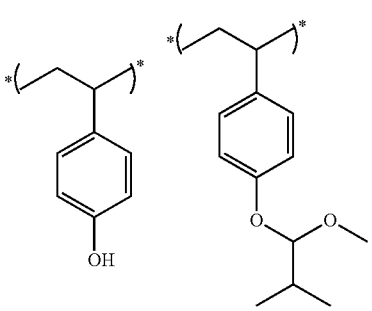

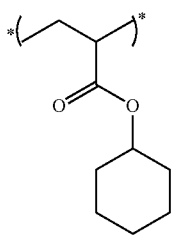

R-13

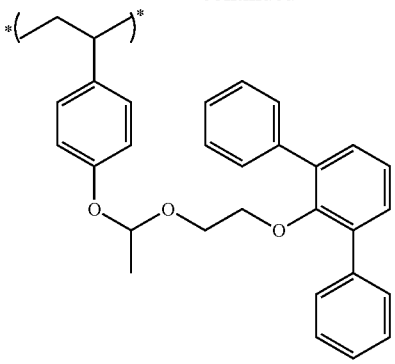

R-16

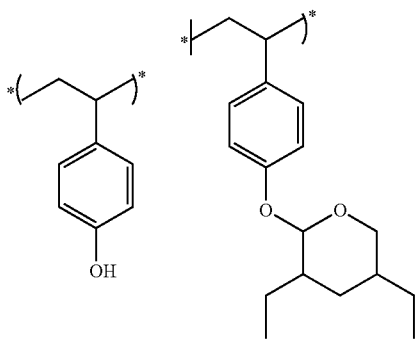

R-14

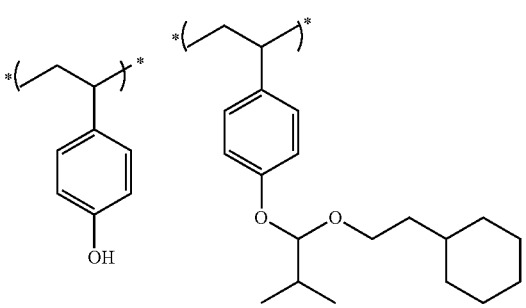

R-17

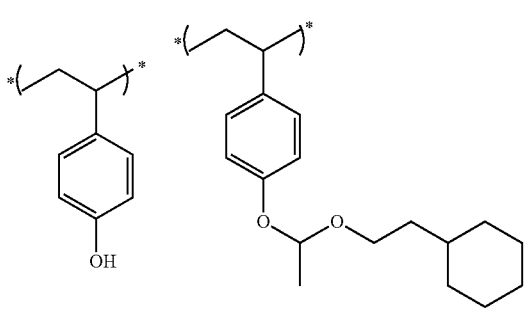

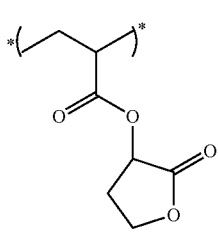

R-15

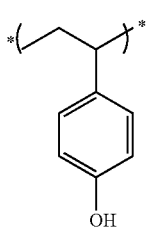

In these specific examples, "tBu" indicates a tert-butyl group.

The content of the group capable of decomposing by the action of an acid is calculated by B/(B+S) using the number (B) of groups capable of decomposing by the action of an acid in the polymer compound (A) and the number (S) of alkali-soluble groups not protected by a group capable of leaving by the action of an acid. The content is preferably from 0.01 to 0.7, more preferably from 0.05 to 0.50, still more preferably from 0.05 to 0.40.

The content of the polymer compound (A) in the composition is preferably from 50 to 95 mass %, more preferably from 55 to 92 mass %, still more preferably from 60 to 85 mass %, based on the entire solid content of the resist composition.

[2] (B) Compound Capable of Generating Acid Upon Irradiation with Actinic Ray or Radiation The positive resist composition of the present invention preferably contains (B) a compound capable of generating an acid upon irradiation with an actinic ray or radiation (hereinafter, sometimes referred to as "acid generator (B)"), more preferably a compound capable of generating an acid except for a carboxylic acid upon irradiation with an actinic ray or radiation. The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Out of the compounds capable of decomposing upon irradiation with an actinic ray or radiation to generate an acid, which are used as the acid generator (B), preferred are the compounds represented by the following formulae (ZI), (ZII) and (ZIII):

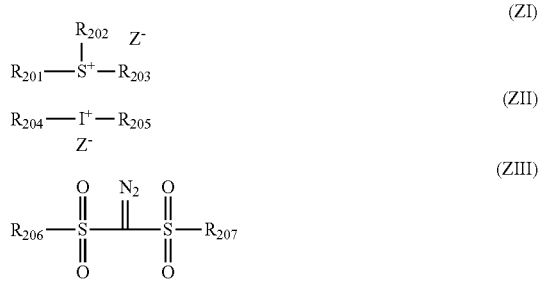

In formula (ZI), each of $R_{201}$, $R_{202}$ and $R_{203}$ independently represents an organic group.

$Z^-$ represents a non-nucleophilic anion, and preferred examples thereof include sulfonate anion, bis(alkylsulfonyl)amide anion, tris(alkylsulfonyl)methide anion, $BF_4^-$, $PF_6^-$ and $SbF_6^-$. The anion is preferably an organic anion containing a carbon atom. Preferred organic anions include organic anions represented by the following formulae AN1 to AN3:

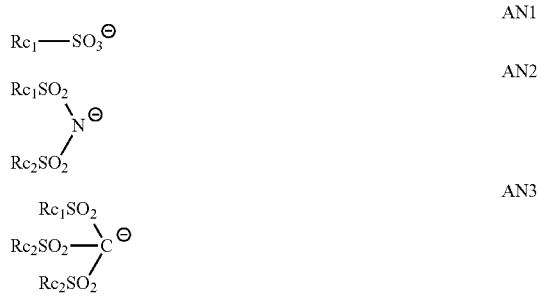

In formulae AN1 to AN3, each of $Rc_1$ to $Rc_3$ independently represents an organic group.

The organic group in $Rc_1$ to $Rc_3$ includes an organic group having a carbon number of 1 to 30 and is preferably an alkyl group which may be substituted, an aryl group which may be substituted, or a group formed by connecting a plurality of these groups through a single bond or a linking group such as —O—, —$CO_2$—, —S—, —$SO_3$— and —$SO_2N(Rd_1)$—. Such a group may further form a ring structure together with another alkyl or aryl group bonded.

$Rd_1$ represents a hydrogen atom or an alkyl group and may form a ring structure together with the alkyl or aryl group bonded.

The organic group of $Rc_1$ to $Rc_3$ may be an alkyl group substituted with a fluorine atom or fluoroalkyl group at the 1-position, or a phenyl group substituted with a fluorine atom or a fluoroalkyl group. By virtue of having a fluorine atom or a fluoroalkyl group, the acidity of the acid generated upon irradiation with light increases and the sensitivity is enhanced. When each of $Rc_1$ to $Rc_3$ has 5 or more carbon atoms, at least one carbon atom is preferably substituted with a hydrogen atom, and it is more preferred that the number of hydrogen atoms is larger than the number of fluorine atoms. The absence of a perfluoroalkyl group having a carbon number of 5 or more enables reduction in the toxicity to ecology.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

The group formed by combining two members out of $R_{201}$ to $R_{203}$ includes an alkylene group (e.g., butylene group, pentylene group).

Specific examples of the organic group as $R_{201}$, $R_{202}$ and $R_{203}$ include the corresponding groups in the compounds (ZI-1), (ZI-2) and (ZI-3) which are described later.

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI).

More preferred components (ZI) include the compounds (ZI-1), (ZI-2) and (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group.

Examples of the arylsulfonium compound include a triarylsulfonium compound, a diarylalkylsulfonium compound and an aryldialkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group and alkyl group as $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a cycloalkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group as $R_{201}$ to $R_{203}$ may be linear or branched but is preferably a linear or branched alkyl group having a carbon number of 1 to 10 (e.g., methyl group, ethyl group, propyl group, butyl group, pentyl group). The cycloalkyl group as $R_{201}$ to $R_{203}$ includes a cycloalkyl group having a carbon number of 3 to 10 (e.g., cyclopentyl group, cyclohexyl group, norbornyl group).

The 2-oxoalkyl group as $R_{201}$ to $R_{203}$ may be linear, branched or cyclic and is preferably a group having >C=O at the 2-position of the above-described alkyl or cycloalkyl group.

The alkoxy group in the alkoxycarbonylmethyl group as $R_{201}$ to $R_{203}$ includes an alkoxy group preferably having a carbon number of 1 to 5 (e.g., methoxy group, ethoxy group, propoxy group, butoxy group, pentoxy group).

Each of $R_{201}$ to $R_{203}$ may be further substituted with a halogen atom, an alkoxy group (for example, having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene group, pentylene group).

The compound (ZI-3) is described below.

The compound (ZI-3) is a compound represented by the following formula (ZI-3), and this is a compound having a phenacylsulfonium salt structure.

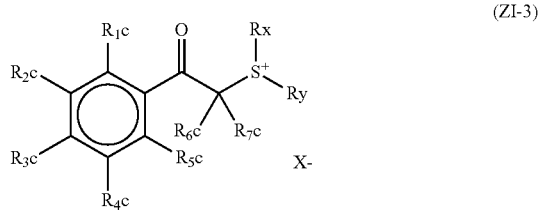

(ZI-3)

Each of $R_{1c}$ to $R_{5c}$ independently represents a hydrogen atom, an alkyl group, an alkoxy group or a halogen atom.

Each of $R_{6c}$ and $R_{7c}$ independently represents a hydrogen atom or an alkyl group.

Each of $R_x$ and $R_y$ independently represents an alkyl group, a 2-oxoalkyl group, an alkoxycarbonylmethyl group, an allyl group or a vinyl group.

Any two or more members out of $R_{1c}$ to $R_{7c}$ may combine to form a ring structure. Also, $R_x$ and $R_y$ may combine to form a ring structure. These ring structures may contain an oxygen atom, a sulfur atom, an ester bond or an amide bond.

$X^-$ has the same meaning as $Z^-$ in formula (ZI).

Specific examples of the compound (ZI-3) include the compounds illustrated in paragraphs 0046 and 0047 of JP-A-2004-233661 and paragraphs 0040 to 0046 of JP-A-2003-35948.

Formulae (ZII) and (ZIII) are described below.

In formulae (ZII) and (ZIII), each of $R_{204}$ to $R_{207}$ independently represents an aryl group which may have a substituent, an alkyl group which may have a substituent, or a cycloalkyl group which may have a substituent.

Specific examples and preferred examples of the aryl group of $R_{204}$ to $R_{207}$ are the same as those described for the aryl group as $R_{201}$ to $R_{203}$ in compound (ZI-1).

Specific examples and preferred examples of the alkyl group and cycloalkyl group of $R_{204}$ to $R_{207}$ are the same as those described for the linear or branched alkyl group and cycloalkyl group as $R_{201}$ to $R_{203}$ in compound (ZI-2).

$Z^-$ has the same meaning as $Z^-$ in formula (ZI).

Out of the compounds capable of generating an acid upon irradiation with an actinic ray or radiation, which are used as the acid generator (C), other preferred compounds include the compounds represented by the following formulae (ZIV), (ZV) and (ZVI):

$$Ar_3\!-\!SO_2\!-\!SO_2\!-\!Ar_4 \qquad \text{ZIV}$$

ZV $R_{208}\!-\!SO_2\!-\!O\!-\!N\!\diagdown\!A$ (with two C=O groups)

ZVI $N\!-\!O\!-\!SO_2\!-\!R_{208}$ with $R_{210}$, $R_{209}$

In formulae (ZIV) to (ZVI), each of $Ar_3$ and $Ar_4$ independently represents a substituted or unsubstituted aryl group.

Each $R_{208}$ in formulae (ZV) and (ZVI) independently represents a substituted or unsubstituted alkyl group, a substituted or unsubstituted cycloalkyl group, or a substituted or unsubstituted aryl group. From the standpoint of increasing the strength of the generated acid, $R_{208}$ is preferably substituted with a fluorine atom.

Each of $R_{209}$ and $R_{210}$ independently represents a substituted or unsubstituted alkyl group, a substituted or unsubstituted cycloalkyl group, a substituted or unsubstituted aryl group, or an electron-withdrawing group. $R_{209}$ is preferably a substituted or unsubstituted aryl group. $R_{210}$ is preferably an electron-withdrawing group, more preferably a cyano group or a fluoroalkyl group.

A represents a substituted or unsubstituted alkylene group, a substituted or unsubstituted alkenylene group, or a substituted or unsubstituted arylene group.

In the present invention, a compound having a plurality of structures represented by formula (ZVI) is also preferred. For example, the compound may be a compound having a structure where either one of $R_{209}$ and $R_{210}$ in a compound represented by formula (ZVI) is bonded to either one of $R_{209}$ and $R_{210}$ in another compound represented by formula (ZVI).

Among the compounds capable of decomposing upon irradiation with an actinic ray or radiation to generate an acid except for a carboxylic acid, which are used as the acid generator (B), the compounds represented by formulae (ZI) to (ZIII) are preferred, the compound represented by formula (ZI) is more preferred, and the compounds represented by (ZI-1) to (ZI-3) are most preferred.

Specific examples of the acid generator (B) are illustrated below, but the present invention is not limited thereto.

(B1)
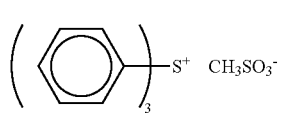

(B2)
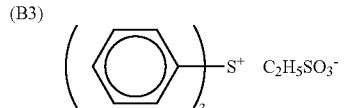

(B3)
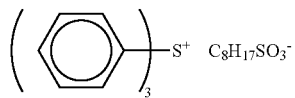

(B4)
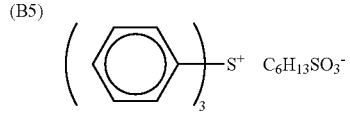

(B5)
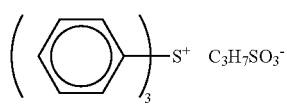

(B6)
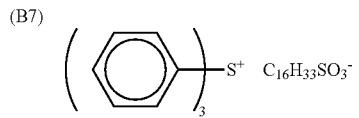

(B7)
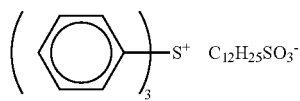

(B8)
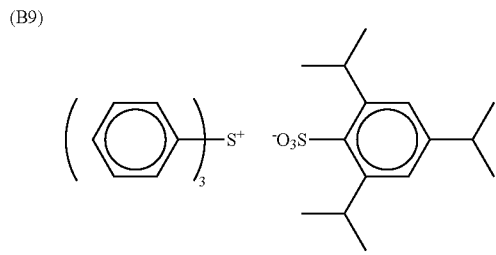

(B9)
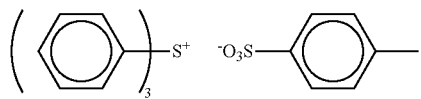

(B10)
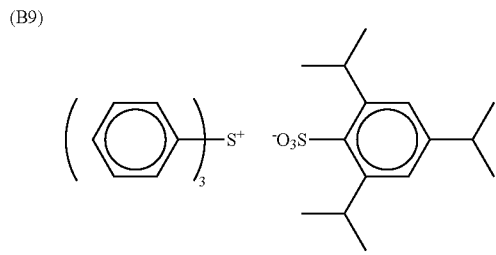

(B11)
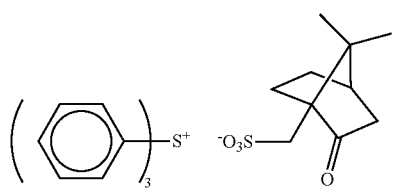

(B12)
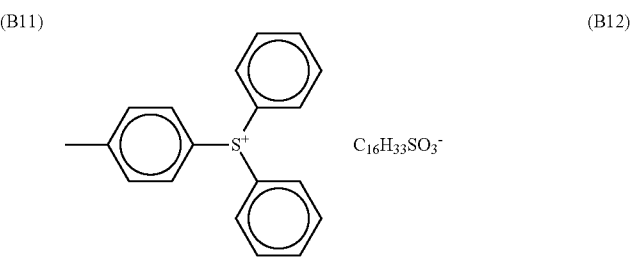

(B13)
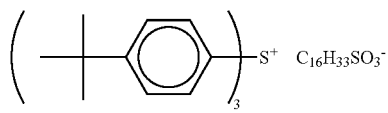

(B14)
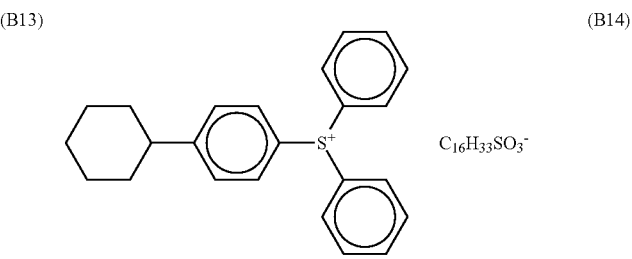

(B15)
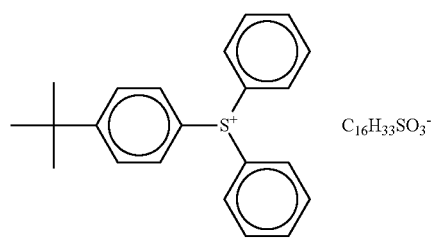

(B16)
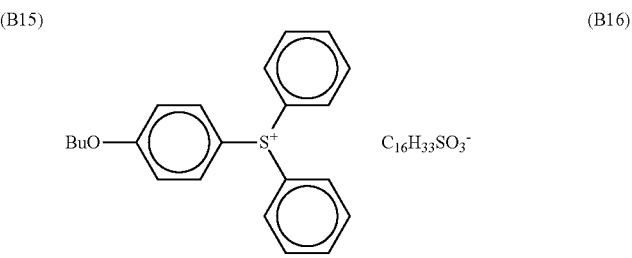

-continued
(B17) 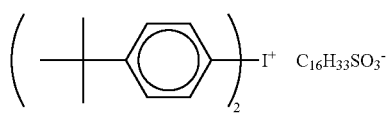
(B18) 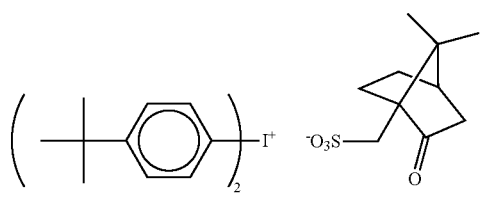
(B19) 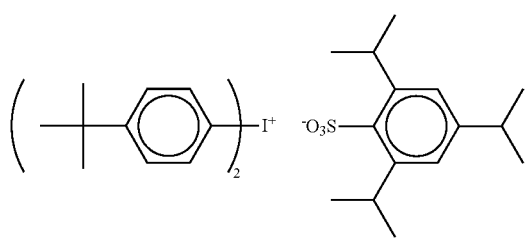
(B20) 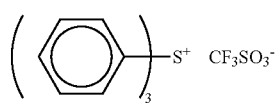
(B21) 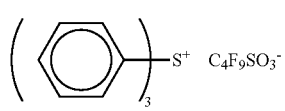
(B22) 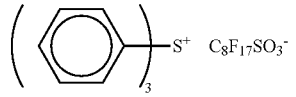
(B23) 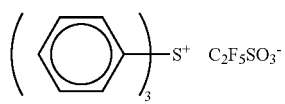
(B24) 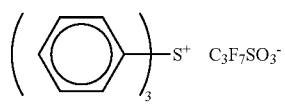
(B25) 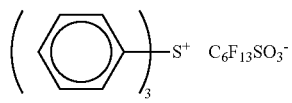
(B26) 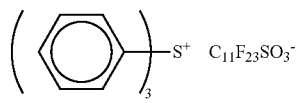
(B27) 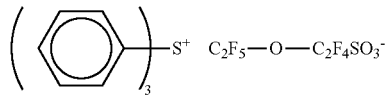
(B28) 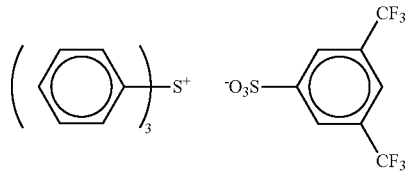
(B29) 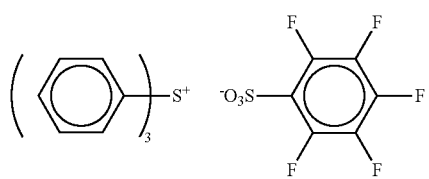
(B30) 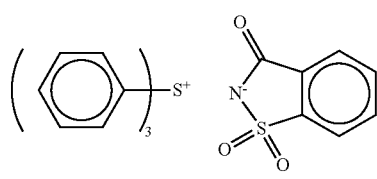
(B31) 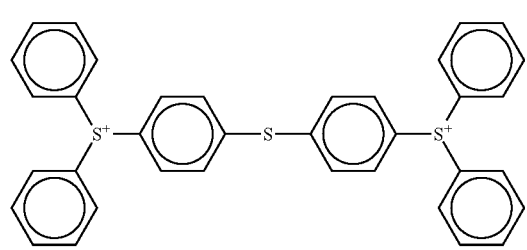
(B32) 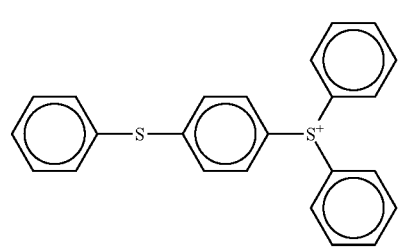
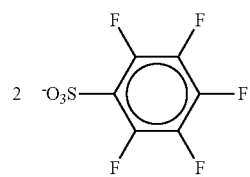
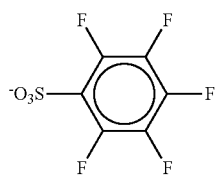

-continued
(B33) 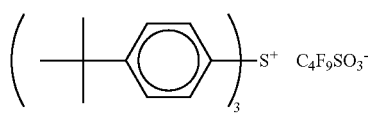
(B34) 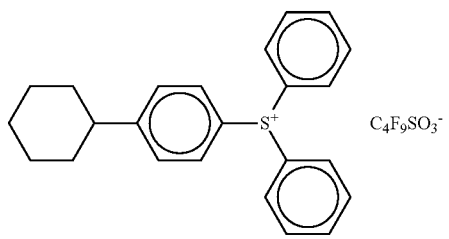
(B35) 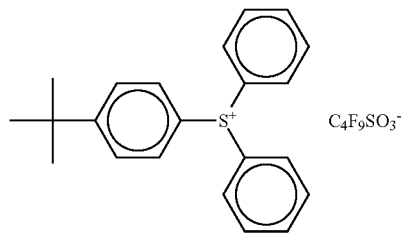
(B36) 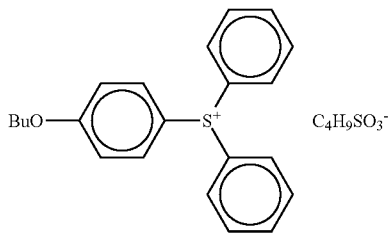
(B37) 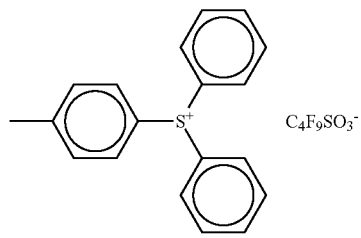
(B38) 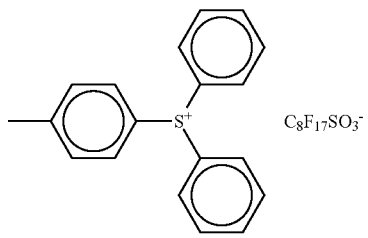
(B39) 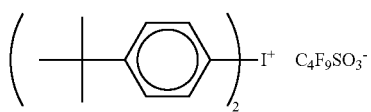
(B40) 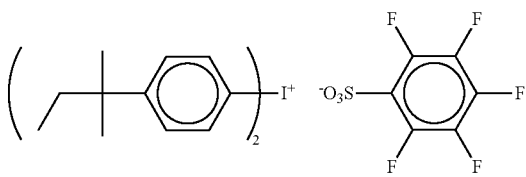
(B41) 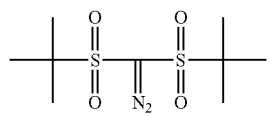
(B42) 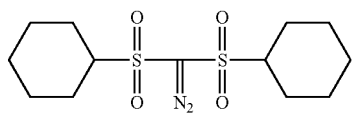
(B43) 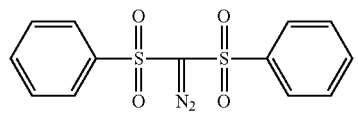
(B44) 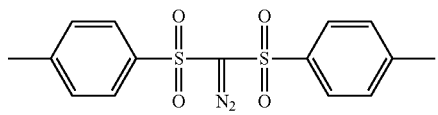
(B45) 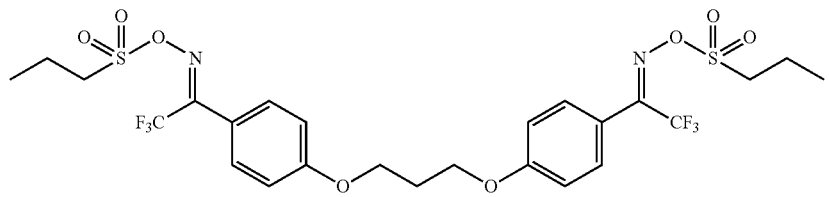
(B46) 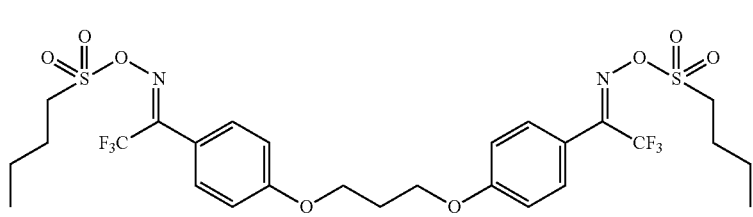

(B47)
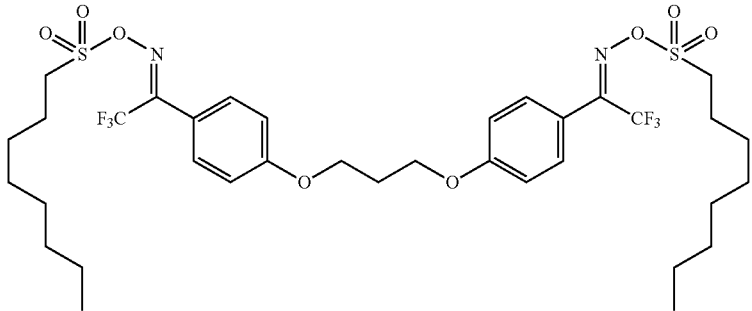
(B48)
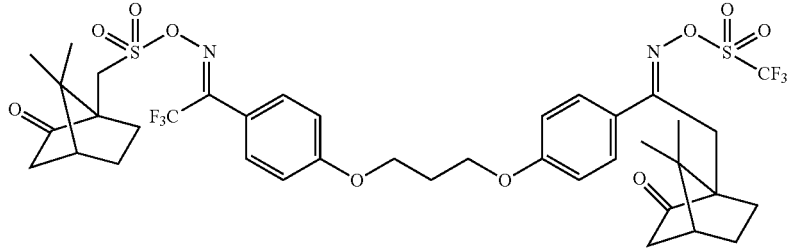
(B49)
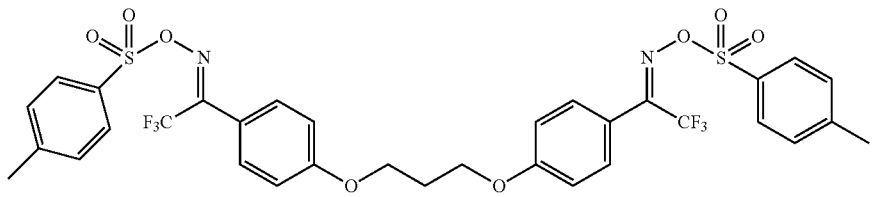
(B50)
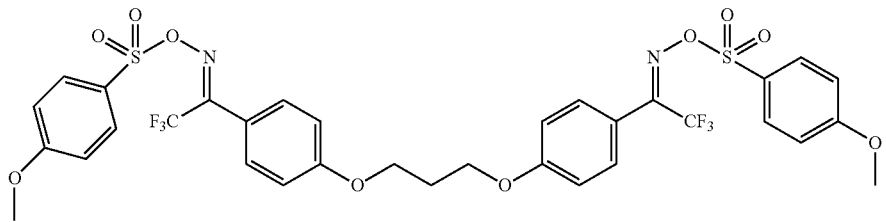
(B51)
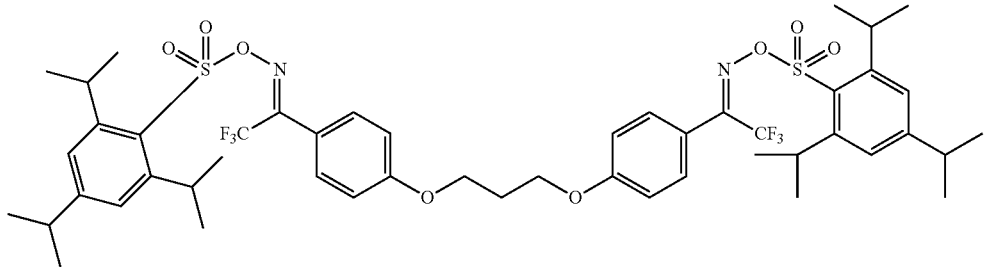
(B52)
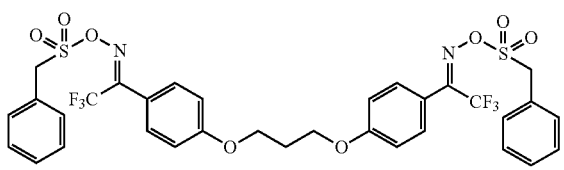
(B53)
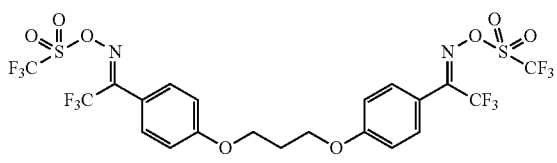

-continued
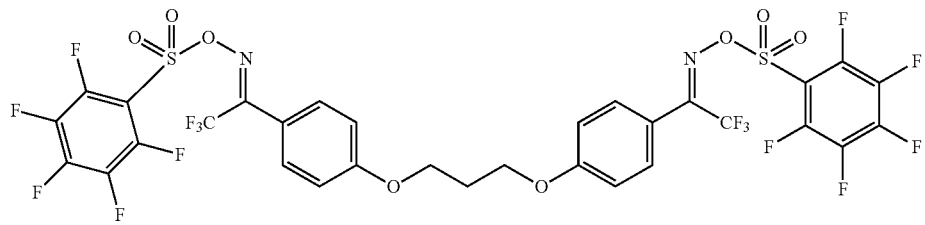
(B54)
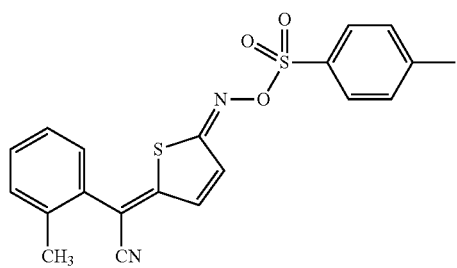
(B55)
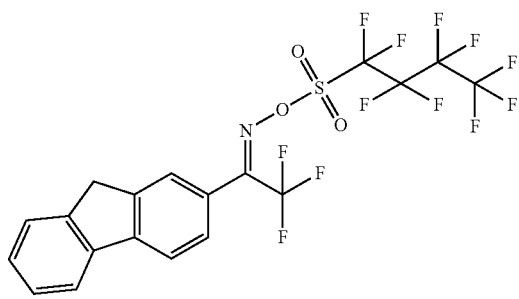
(B56)
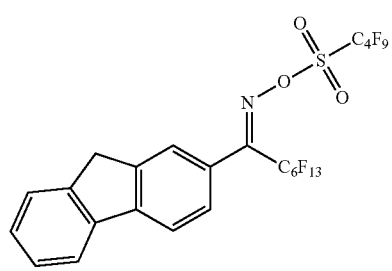
(B57)
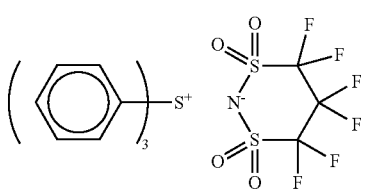
(B58)
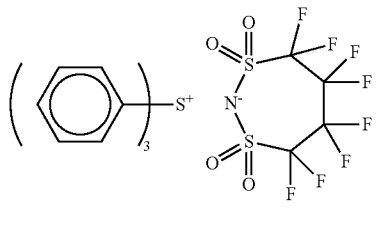
(B59)
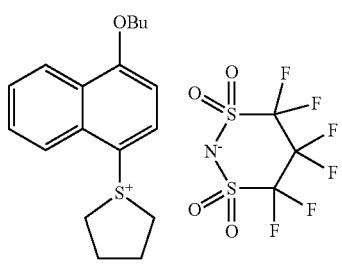
(B60)
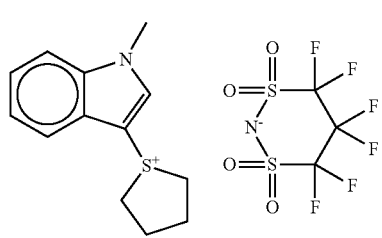
(B61)
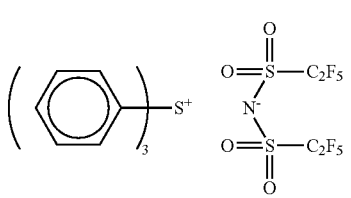
(B62)
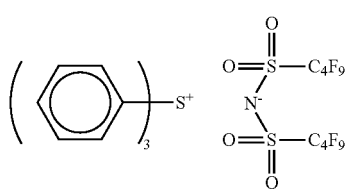
(B63)
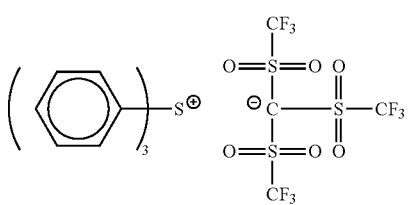
(B64)

-continued

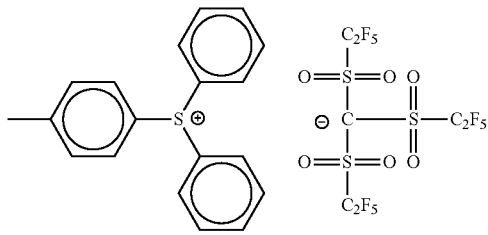
(B65)

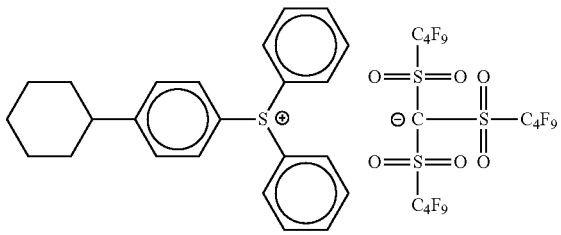
(B66)

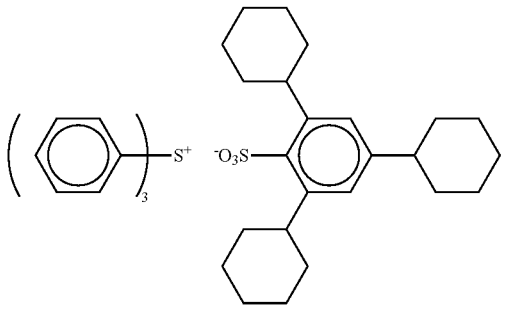
(B67)

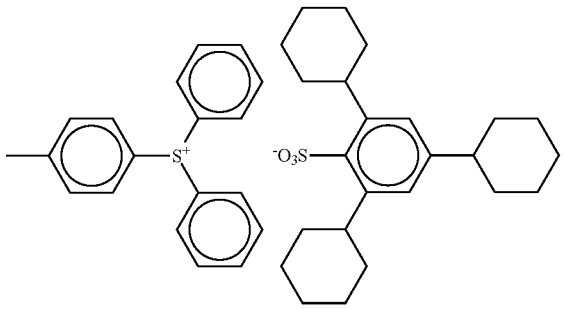
(B68)

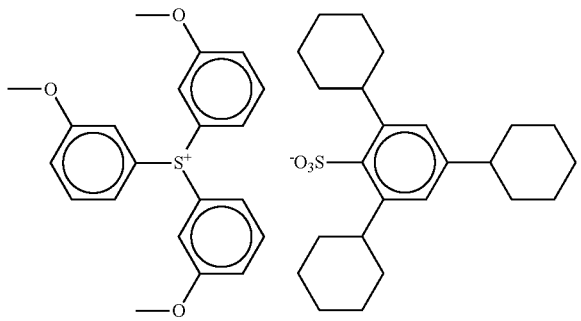
(B69)

As for the acid generator (B), one kind of a compound may be used alone, or two or more kinds of compounds may be used in combination. In the case of using two or more kinds of compounds in combination, two or more kinds of compounds capable of generating organic acids differing in the number of all atoms excluding hydrogen atom by 2 or more are preferably combined.

The content of the acid generator (B) in the composition is preferably from 5 to 50 mass %, more preferably from 8 to 40 mass %, still more preferably from 10 to 40 mass %, based on the entire solid content of the resist composition.

[3] (C) Basic Compound

The positive resist composition of the present invention preferably contains a basic compound.

The basic compound is preferably a nitrogen-containing organic basic compound.

The usable compound is not particularly limited, but, for example, compounds classified into the following (1) to (4) are preferably used.

(1) Compound Represented by the Following Formula (BS-1):

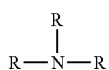
(BS-1)

In formula (BS-1), each R independently represents any of a hydrogen atom, an alkyl group (linear or branched), a cycloalkyl group (monocyclic or polycyclic), an aryl group and an aralkyl group, but it is not allowed that three R all are a hydrogen atom.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples of the aryl group include a phenyl group and a naphthyl group.

The carbon number of the aralkyl group as R is not particularly limited but is usually from 7 to 20, preferably from 7 to 11. Specific examples of the aralkyl group include a benzyl group.

In the alkyl group, cycloalkyl group, aryl group and aralkyl group as R, a hydrogen atom may be replaced by a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group and an alkyloxycarbonyl group.

In the compound represented by formula (BS-1), it is preferred that only one of three R is a hydrogen atom or all R are not a hydrogen atom.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecyl amine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(tert-butyl)aniline.

Also, one preferred embodiment is a compound where in formula (BS-1), at least one R is an alkyl group substituted with a hydroxyl group. Specific examples of the compound include triethanolamine and N,N-dihydroxyethylaniline.

The alkyl group as R may contain an oxygen atom in the alkyl chain to form an alkyleneoxy chain. The alkyleneoxy chain is preferably —$CH_2CH_2O$—. Specific examples thereof include tris(methoxyethoxyethyl)amine and compounds illustrated in column 3, line 60 et seq. in the specification of U.S. Pat. No. 6,040,112.

(2) Compound Having a Nitrogen-Containing Heterocyclic Structure

The heterocyclic structure may or may not have aromaticity, may contain a plurality of nitrogen atoms, and may further contain a heteroatom other than nitrogen. Specific examples of the compound include a compound having an imidazole structure (e.g., 2-phenylbenzimidazole, 2,4,5-triphenylimidazole), a compound having a piperidine structure (e.g., N-hydroxyethylpiperidine, bis(1,2,2,6,6-pentamethyl-4-piperidyl)sebacate), a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group of an amine compound has a phenoxy group at the terminal opposite the nitrogen atom. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

A compound having at least one alkyleneoxy chain between the phenoxy group and the nitrogen atom is preferred. The number of alkyleneoxy chains per molecule is preferably from 3 to 9, more preferably from 4 to 6. Among alkyleneoxy chains, —$CH_2CH_2O$— is preferred.

Specific examples of the compound include 2-{2-[2-(2,2-dimethoxy-phenoxyethoxy)ethyl]-bis-(2-methoxyethyl)]-amine and Compounds (C1-1) to (C3-3) illustrated in paragraph [0066] in the specification of U.S. Patent Application Publication No. 2007/0224539A1.

(4) Ammonium Salt

An ammonium salt may also be appropriately used. The ammonium salt is preferably a hydroxide or a carboxylate. More specifically, a tetraalkylammonium hydroxide typified by tetrabutylammonium hydroxide is preferred. In addition, ammonium salts derived from amines of (1) to (3) above may be also used.

Other examples of the basic compound which can be used in the composition of the present invention include compounds synthesized in Examples of JP-A-2002-363146 and compounds described in paragraph 0108 of JP-A-2007-298569.

As for the basic compound, one kind of a compound is used alone, or two or more kinds of compounds are used in combination.

The amount of the basic compound used is usually from 0.001 to 10 mass %, preferably from 0.01 to 5 mass %, based on the solid content of the composition.

The molar ratio of acid generator/basic compound is preferably from 2 to 300. That is, the molar ratio is preferably 2 or more in view of sensitivity and resolution and is preferably 300 or less from the standpoint of suppressing the reduction in resolution due to thickening of the pattern with aging after exposure until heat treatment. The molar ratio is more preferably from 3 to 200, still more preferably from 4 to 150.

[4] Surfactant

The composition of the present invention may further contain a surfactant. In the case of containing a surfactant, the surfactant is preferably a fluorine-containing and/or silicon-containing surfactant.

Examples of the surfactant above include Megaface F176 and Megaface R08 produced by DIC Corporation; PF656 and PF6320 produced by OMNOVA; Troysol S-366 produced by Troy Chemical; Florad FC430 produced by Sumitomo 3M Inc.; and polysiloxane polymer KP-341 produced by Shin-Etsu Chemical Co., Ltd.

A surfactant other than the fluorine-containing and/or silicon-containing surfactant may be also used. Specific examples thereof include polyoxyethylene alkyl ethers and polyoxyethylene alkylaryl ethers.

In addition, known surfactants may be appropriately used. Examples of the surfactant which can be used include surfactants described in paragraph [0273] et seq. in the specification of U.S. Patent Application Publication No. 2008/0248425A1.

One kind of a surfactant may be used alone, or two or more kinds of surfactants may be used in combination.

The amount of the surfactant used is preferably from 0 to 2 mass %, more preferably from 0.0001 to 2 mass %, still more preferably from 0.0005 to 0.5 mass %, based on the entire solid content (the entire amount excluding the solvent) of the positive resist composition.

[5] Resist Solvent

The solvent which can be used in preparing the composition are not particularly limited as long as it can dissolve respective components, and examples of the solvent include an alkylene glycol monoalkyl ether carboxylate (e.g., propylene glycol monomethyl ether acetate (PGMEA; 1-methoxy-2-acetoxypropane)), an alkylene glycol monoalkyl ether (e.g., propylene glycol monomethyl ether (PGME; 1-methoxy-2-propanol)), an alkyl lactate (e.g., ethyl lactate, methyl lactate), a cyclic lactone (e.g., γ-butyrolactone, preferably having a carbon number of 4 to 10), a chain or cyclic ketone (e.g., 2-heptanone, cyclohexanone, preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (e.g., ethyl ethoxypropionate). Other examples of the usable solvent include the solvents described in paragraph [0244] et seq. in the specification of U.S. Patent Application Publication No. 2008/0248425A1.

Among these solvents, an alkylene glycol monoalkyl ether carboxylate and an alkylene glycol monoalkyl ether are preferred.

One of these solvents may be used alone, or two or more thereof may be mixed and used. In the case of mixing two or more solvents, it is preferred to mix a solvent having a hydroxyl group and a solvent not having a hydroxyl group. The mass ratio between the solvent having a hydroxyl group and the solvent not having a hydroxyl group is usually from 1/99 to 99/1, preferably from 10/90 to 90/10, more preferably from 20/80 to 60/40.

The solvent having a hydroxyl group is preferably an alkylene glycol monoalkyl ether, and the solvent not having a hydroxyl group is preferably an alkylene glycol monoalkyl ether carboxylate.

The amount used of the solvent based on the entire amount of the composition of the present invention may be appropriately adjusted according to the desired film thickness or the like, but in general, the amount used is adjusted such that the entire solid content concentration of the composition becomes from 0.5 to 5 mass %, preferably from 0.8 to 3 mass %, more preferably from 0.8 to 2 mass %, still more preferably from 0.8 to 1.5 mass %.

[6] Other Additives

Other than the above-described components, the composition of the invention may appropriately contain an onium carboxylate, a dissolution inhibiting compound having a molecular weight of 3,000 or less described, for example, in Proceeding of SPIE, 2724, 355 (1996), a dye, a plasticizer, a photosensitizer, a light absorber, an antioxidant and the like. Also, in the case of using EUV as the exposure light source, the composition may contain an additive capable of absorbing out-of-band light. Examples of the out-of-band light absorber include the aromatic compounds described in U.S. Patent Application Publication No. 2006/0223000.

EXAMPLES

The present invention is described below by referring to Examples, but the present invention should not be construed as being limited thereto.

Synthesis Example 1

Synthesis of Polymer Compound (R-11)

Poly(p-hydroxystyrene) (VP-2500, produced by Nippon Soda Co., Ltd.) (30 g) as a polyhydroxystyrene compound was dissolved in 120 g of PGMEA (propylene glycol monomethyl ether acetate). To this solution, 10.40 g of 2-cyclohexylethyl vinyl ether as a vinyl ether compound and 1.45 g of 2 mass % comphorsulfonic acid (PGMEA solution) were added thereto, and the mixture was stirred at room temperature for 2 hours. Furthermore, 1.05 g of 10 mass % triethylamine (PGMEA solution) was added and after stirring for a while, the reaction solution was transferred to a separating funnel containing 165 mL of ethyl acetate. The organic layer was washed with 200 mL of distilled water three times, and ethyl acetate was removed in an evaporator. The obtained reaction solution was added dropwise to 2 L of hexane, and the supernatant was removed. The obtained product was dissolved in 95 g of PGMEA, and the low-boiling-point solvent was removed under reduced pressure conditions to obtain 132.3 g of a PGMEA solution (28.3 mass %) of Polymer Compound (R-11).

With respect to Polymer Compound (R-11), the molar ratio of respective repeating units was determined using $^1$H-NMR and $^{13}$C-NMR. Also, the mass average molecular weight (Mw) in terms of polystyrene and the polydispersity (Mw/Mn) were determined using GPC (solvent: THF). The results are shown in Table 1 below In Table 1, the molar ratio of respective repeating units (corresponding to repeating units starting from the left) is shown in the column of "Compositional Ratio", and the mass average molecular weight in terms of polystyrene as measured using GPC (solvent: THF) is shown in the column of "Mw". Also, the polydispersity Mw/Mn is shown in the column of "Polydispersity".

In Table 1, Polymer Compounds (R-8), (R-10) and (R-17) were synthesized by the same method as in the synthesis example of Polymer Compound (R-11) except for differing in the acetalizing agent.

Polymer Compound (R-12) was synthesized by obtaining a precursor of Polymer Compound (R-12) by a known radical polymerization method using p-acetoxystyrene and cyclohexyl acrylate and thereafter, introducing an acetal protective group by the same operation as in Polymer Compound (R-11) except for differing in the acetalizing agent.

Polymer-X1 was synthesized by a known radical polymerization method using p-acetoxystyrene and tert-butyl methacrylate.

TABLE 1

| Polymer Compound (A) | Mass Average Molecular Weight (Mw) | Polydispersity (Mw/Mn) | Compositional Ratio (molar ratio, from left) |
|---|---|---|---|
| 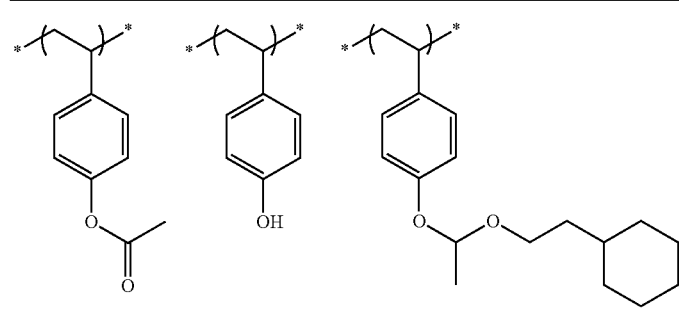 R-8 | 5500 | 1.1 | 10/70/20 |

TABLE 1-continued
| Polymer Compound (A) | Mass Average Molecular Weight (Mw) | Polydispersity (Mw/Mn) | Compositional Ratio (molar ratio, from left) |
|---|---|---|---|
| 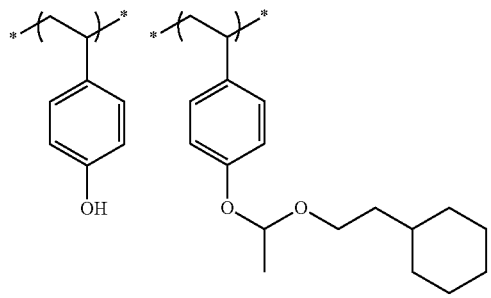 R-11 | 5400 | 1.1 | 75/25 |
| 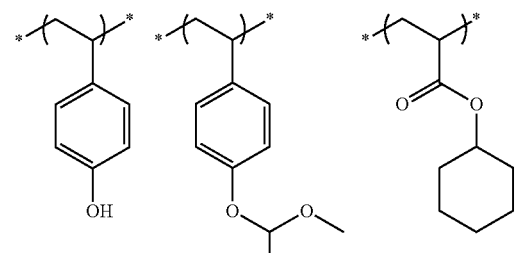 R-12 | 6500 | 1.4 | 70/25/5 |
| 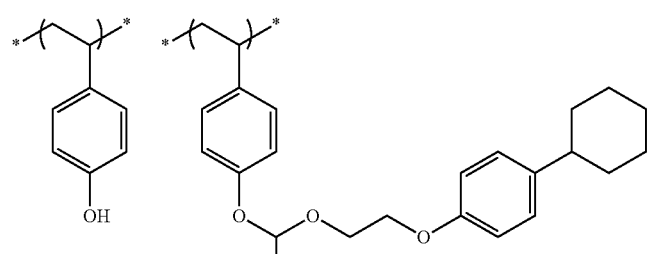 R-10 | 5500 | 1.1 | 85/15 |
| 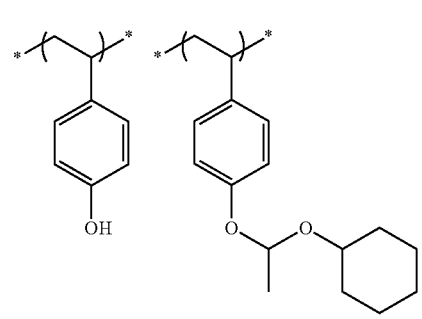 R-17 | 5300 | 1.1 | 75/25 |

TABLE 1-continued

| Polymer Compound (A) | Mass Average Molecular Weight (Mw) | Polydispersity (Mw/Mn) | Compositional Ratio (molar ratio, from left) |
|---|---|---|---|
| 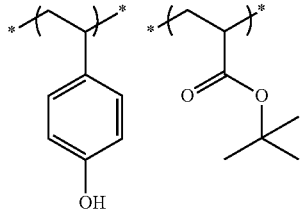 Polymer-X1 | 8500 | 1.5 | 70/30 |

[Compositions 1 to 10]

Respective components shown in Table 2 below were dissolved in the solvent shown in Table 2, and the obtained solution was filtered using a polyethylene filter having a pore size of 0.1 μm.

TABLE 2

| | Polymer Compound (A) | Acid Generator (B) | | Basic Compound (C) | | Surfactant | Solvent | | |
|---|---|---|---|---|---|---|---|---|---|
| Composition 1 | R-8 0.79 g | B10 0.2 g | | DBN 0.01 g | | W-1 0.005 g | PGMEA 60 g | PGME 15 g | |
| Composition 2 | R-8 0.7 g | B69 0.28 g | | TBAH 0.02 g | | W-2 0.005 g | PGMEA 60 g | PGME 15 g | |
| Composition 3 | R-10 0.666 g | B67 0.15 g | B68 0.15 g | TDA 0.034 g | | W-1 0.005 g | PGMEA 30 g | PGME 30 g | EL 15 g |
| Composition 4 | R-10 0.705 g | B69 0.28 g | | TBAH 0.01 g | DBN 0.005 g | W-2 0.005 g | PGMEA 60 g | PGME 15 g | |
| Composition 5 | R-11 0.73 g | B67 0.25 g | | TBAH 0.02 g | | W-2 0.005 g | PGMEA 30 g | PGME 30 g | EL 15 g |
| Composition 6 | R-11 0.71 g | B69 0.28 g | | DBN 0.01 g | | — 0 g | PGMEA 60 g | PGME 15 g | |
| Composition 7 | R-11 0.565 g | B67 0.4 g | | TBAH 0.035 g | | — 0 g | PGMEA 30 g | PGME 30 g | EL 15 g |
| Composition 8 | R-12 0.7 g | B69 0.28 g | | TBAH 0.02 g | | W-2 0.005 g | PGMEA 60 g | PGME 15 g | |
| Composition 9 | R-17 0.7 g | B69 0.28 g | | TBAH 0.02 g | | W-2 0.005 g | PGMEA 60 g | PGME 15 g | |
| Composition 10 | Polymer-X1 0.766 g | B28 0.2 g | | TDA 0.034 g | | W-2 0.005 g | PGMEA 60 g | PGME 15 g | |

Details of respective components denoted in abbreviations in Table 2 are given below.

<(B) Compound Capable of Generating Acid Upon Irradiation with Actinic Ray or Radiation (Acid Generator)>

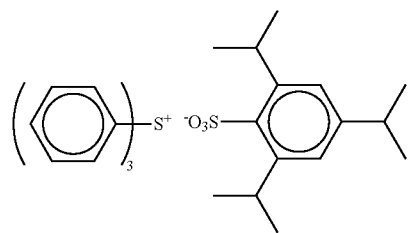

(B10)

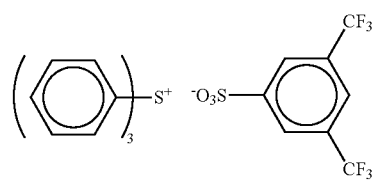

(B28)

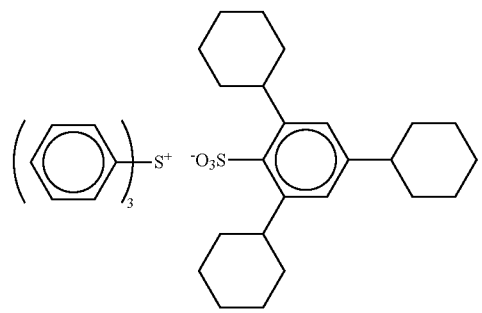

(B67)

-continued

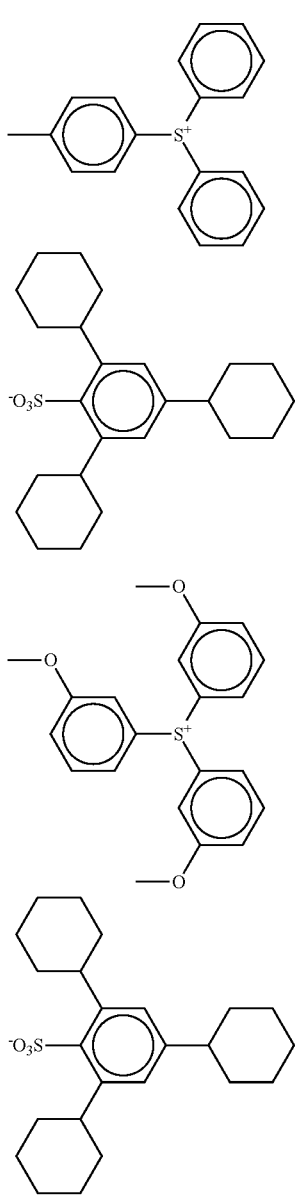

(B68)

(B69)

<(C) Basic Compound>
TBAH: Tetrabutylammonium hydroxide
DBN: 1,5-Diazabicyclo[4.3.0]non-5-ene
TDA: Tri-n-decylamine
<Surfactant>
W-1: Megaface F176 (produced by DIC Corporation)
W-2: PF6320 (produced by OMNOVA)
<Solvent>
PGMEA: Propylene glycol monomethyl ether acetate
PGME: Propylene glycol monomethyl ether
EL: Ethyl lactate EB Exposure Evaluation 1

Examples 1 to 15 and Comparative Examples 1 to 6

Resist patterns were formed using Compositions 1 to 10 shown in Table 2 by the following operation. Details of the conditions for resist pattern formation are shown in Table 3.

[Coating of Resist]

The positive resist solution prepared was uniformly applied on a hexamethyldisilazane-treated silicon substrate by using a spin coater and dried by heating on a hot plate at 120° C. for 90 seconds. Incidentally, the thickness of the coated film shown in Table 3 is the film thickness after drying by heating.

[Exposure]

The resist film was exposed to a line pattern (length direction: 0.5 mm, number of lines drawn: 40) having a line width of 20 to 30 nm in steps of 2.5 nm by using an electron beam irradiation apparatus (JBX6000, manufactured by JEOL, accelerating voltage: 50 keV) and varying the irradiation dose.

[Post-Exposure Baking]

Immediately after the irradiation, the resist film was heated on a hot plate at 110° C. for 90 seconds.

[Development]

1. Shower Development

Using a shower-type developing apparatus (ADE3000S, manufactured by ACTES), development was performed by spraying and ejecting the alkali developer (23° C.) shown in Table 3 at a flow rate of 200 mL/min for the time shown in Table 3 while rotating the wafer at 50 revolutions (rpm).

Thereafter, a rinsing treatment was performed by spraying and ejecting pure water used as the rinsing solution (23° C.) at a flow rate of 200 mL/min for 30 seconds while rotating the wafer at 50 revolutions (rpm).

Finally, the wafer was dried by high-speed spinning at 2,500 revolutions (rpm) for 60 seconds.

2. Puddle Development

Using a shower-type developing apparatus (ADE3000S, manufactured by ACTES), the alkali developer (23° C.) shown in Table 3 was sprayed and ejected at a flow rate of 200 mL/min for 5 seconds while rotating the wafer at 50 revolutions (rpm), to raise the developer on the wafer. Subsequently, rotation of the wafer was stopped, and development was performed by leaving the wafer to stand still for the time shown in Table 3.

Thereafter, a rinsing treatment was performed by spraying and ejecting pure water used as the rinsing solution (23° C.) at a flow rate of 200 mL/min for 30 seconds while rotating the wafer at 50 revolutions (rpm).

The alkali development time shown in Table 3 was determined by the following method.

A composition where out of the composition components shown in Table 2, the polymer compound was changed to the polymer compound before acetal protection, was prepared. As for Comparative Example 6, the polymer compound was synthesized by using methacrylic acid in place of tert-butyl methacrylate.

The composition was uniformly coated on a hexamethyldisilazane-treated silicon substrate by using a spin coater and dried by heating on a hot plate under the same conditions as above to prepare a wafer coated with a composition.

Subsequently, the wafer was developed under the conditions shown in Table 3 and after the completion of development, the film thickness of the wafer was measured. The development time required when the alkali developer was used in each concentration was determined by rating that the wafer with remaining of the resist was B and the wafer without remaining of the resist was A. As Reference Example, the results of determining the development time described in Example 2 are shown in Table 4.

Incidentally, in Table 3, the amount added shown in the column of Other Additives is the value in terms of mass % based on the entire mass of the alkali developer. Also, in the Tables below, TMAH means an aqueous tetramethylammonium hydroxide solution, and Surfynol 440 means Surfynol 440 (produced by Nissin Chemical Industry Co., Ltd.).

TABLE 3

| | Composition | Thickness of Coated Resist Film | Developer Alkali Species | Developer Alkali Concentration (mass %) | Developer Other Additives (mass %) | Development Time | Mode of Development |
|---|---|---|---|---|---|---|---|
| Example 1 | Composition 1 | 30 nm | TMAH | 1.0% | Surfynol 440 (0.02%) | 90 sec | shower |
| Example 2 | Composition 2 | 25 nm | TMAH | 1.0% | | 120 sec | shower |
| Example 3 | Composition 3 | 25 nm | TMAH | 0.8% | | 120 sec | shower |
| Example 4 | Composition 4 | 25 nm | TMAH | 0.8% | | 150 sec | shower |
| Example 5 | Composition 4 | 25 nm | TMAH | 0.8% | isopropyl alcohol (10%) | 150 sec | shower |
| Example 6 | Composition 5 | 25 nm | TMAH | 0.6% | | 300 sec | shower |
| Example 7 | Composition 5 | 25 nm | TMAH | 0.8% | | 120 sec | shower |
| Example 8 | Composition 5 | 25 nm | TMAH | 1.1% | | 60 sec | shower |
| Example 9 | Composition 6 | 25 nm | TMAH | 0.8% | | 180 sec | shower |
| Example 10 | Composition 7 | 25 nm | TMAH | 0.5% | | 500 sec | shower |
| Example 11 | Composition 8 | 25 nm | TMAH | 0.8% | | 180 sec | shower |
| Example 12 | Composition 9 | 25 nm | TMAH | 0.8% | | 180 sec | shower |
| Example 13 | Composition 6 | 25 nm | TMAH | 0.8% | | 180 sec | puddle |
| Example 14 | Composition 6 | 15 nm | TMAH | 0.8% | | 120 sec | shower |
| Example 15 | Composition 6 | 40 nm | TMAH | 0.8% | | 150 sec | shower |
| Comparative Example 1 | Composition 1 | 50 nm | TMAH | 0.8% | | 180 sec | shower |
| Comparative Example 2 | Composition 1 | 10 nm | TMAH | 0.8% | | 180 sec | shower |
| Comparative Example 3 | Composition 6 | 25 nm | TMAH | 1.19% | | 60 sec | shower |
| Comparative Example 4 | Composition 6 | 25 nm | TMAH | 0.3% | | 800 sec | shower |
| Comparative Example 5 | Composition 6 | 25 nm | TMAH | 2.38% | | 15 sec | shower |
| Comparative Example 6 | Composition 10 | 25 nm | TMAH | 1.19% | | 60 sec | shower |

TABLE 4

(Reference Example: Method for Determining Development Time)

| | Film Thickness | Alkali Species | Alkali Concentration (mass %) | Mode of Development | Development Time | Presence or Absence of Resist after Development | Development Time Required |
|---|---|---|---|---|---|---|---|
| Composition 2' | 25 nm | TMAH | 1.0% | shower | 60 sec | B | 120 sec |
| | | TMAH | 1.0% | shower | 120 sec | A | |
| | | TMAH | 1.0% | shower | 180 sec | A | |

The resist pattern was evaluated for the following items. Details of the results are shown in Table 5.

[Sensitivity]

The obtained pattern was observed by using a scanning electron microscope (S-9220, manufactured by Hitachi, Ltd.). The irradiation energy when separately resolving line and space at a ratio of 1:1 for a line width of 30 nm was taken as the sensitivity ($\mu C/cm^2$).

[Resolution]

The minimum line width below which the line and space are not separately resolved at a ratio of 1:1 was taken as the resolution (nm).

[Line Edge Roughness (LER)]

At arbitrary 30 points in the longitudinal 1 μm region of the line pattern with a line width of 30 nm, the distance from the reference line where the edge should be present was measured using a scanning electron microscope (S-9220, manufactured by Hitachi, Ltd.), and after determining the standard deviation, 3σ was computed. A smaller value indicates better performance in terms of line edge roughness.

[Profile]

The profile of the pattern with a line width of 30 nm at the irradiation dose giving the sensitivity above was observed using an electron microscope (S-4800, manufactured by Hitachi, Ltd.), and the pattern was rated A when the profile is close to rectangle and otherwise, rated B or C depending on the degree. The results are shown with comments on the profile.

TABLE 5

| | Sensitivity ($\mu C/cm^2$) | Resolution (nm) | LER (nm) | Pattern Profile |
|---|---|---|---|---|
| Example 1 | 100 | 22.5 | 4.2 | A |
| Example 2 | 100 | 22.5 | 4.0 | A |
| Example 3 | 100 | 20.0 | 3.5 | A |
| Example 4 | 100 | 20.0 | 3.5 | A |
| Example 5 | 100 | 20.0 | 3.5 | A |
| Example 6 | 120 | 20.0 | 3.2 | A |
| Example 7 | 100 | 20.0 | 3.8 | A |
| Example 8 | 80 | 22.5 | 4.2 | A |
| Example 9 | 100 | 20.0 | 4.0 | A |

TABLE 5-continued

|  | Sensitivity ($\mu C/cm^2$) | Resolution (nm) | LER (nm) | Pattern Profile |
| --- | --- | --- | --- | --- |
| Example 10 | 100 | 20.0 | 3.0 | A |
| Example 11 | 100 | 22.5 | 5.0 | A |
| Example 12 | 100 | 20.0 | 3.5 | A |
| Example 13 | 100 | 22.5 | 4.5 | A |
| Example 14 | 120 | 22.5 | 5.0 | A |
| Example 15 | 90 | 22.5 | 4.0 | A |
| Comparative Example 1 | 90 | 30.0 | 4.0 | C (partial collapse) |
| Comparative Example 2 | 130 | 27.5 | 5.5 | C (film loss) |
| Comparative Example 3 | 85 | 25.0 | 6.0 | C (film loss/residue in space part) |
| Comparative Example 4 | 150 | 20.0 | 4.5 | C (residue in space part) |
| Comparative Example 5 | 60 | 30.0 | 6.0 | C (film loss/residue in space part) |
| Comparative Example 6 | 70 | 25.0 | 6.0 | A |

It is seen from the results in Table 5 that the resist pattern forming method according to the present invention can satisfy high sensitivity, high resolution, small line edge roughness (LER) and excellent pattern profile all at the same time.

EB Exposure Evaluation 2

Examples 16 to 18

Resist patterns were formed and evaluated by the same operation as in EB Exposure Evaluation 1 except for applying the prepared positive resist solution on a Cr oxide film-deposited 6-inch wafer. The conditions for pattern formation and the evaluation results of each pattern are shown in Tables 6 and 7.

TABLE 6

|  | Composition | Thickness of Coated Resist Film | Developer Alkali Species | Alkali Concentration (mass %) | Mode of Development | Development Time |
| --- | --- | --- | --- | --- | --- | --- |
| Example 16 | Composition 5 | 25 nm | TMAH | 0.6 mass % | shower | 300 sec |
| Example 17 | Composition 6 | 25 nm | TMAH | 0.8 mass % | shower | 180 sec |
| Example 18 | Composition 8 | 25 nm | TMAH | 0.8 mass % | shower | 180 sec |

TABLE 7

|  | Sensitivity ($\mu C/cm^2$) | Resolution (nm) | LER (nm) | Pattern Profile |
| --- | --- | --- | --- | --- |
| Example 16 | 120 | 20 | 4.2 | A |
| Example 17 | 100 | 20 | 4.5 | A |
| Example 18 | 100 | 20 | 4.2 | A |

It is seen from the results in Table 7 that the resist pattern forming method according to the present invention is applicable also to the production of a nanoimprint mold or a photomask.

EUV Exposure Evaluation 1

Examples 19 to 21

Resist patterns were formed and subjected to the same evaluations except for resolution by the same operations as in EB Exposure Evaluation 1 except for performing the exposure by using EUV light (wavelength: 13 nm) through a 1:1 line-and-space mask pattern with a line width of 30 nm. The conditions for pattern formation and the evaluation results of each pattern are shown in Tables 8 and 9.

TABLE 8

|  | Composition | Thickness of Coated Resist Film | Developer Alkali Species | Alkali Concentration (mass %) | Mode of Development | Development Time |
| --- | --- | --- | --- | --- | --- | --- |
| Example 19 | Composition 5 | 25 nm | TMAH | 0.6 mass % | shower | 300 sec |
| Example 20 | Composition 6 | 25 nm | TMAH | 0.8 mass % | shower | 180 sec |
| Example 21 | Composition 8 | 25 nm | TMAH | 0.8 mass % | shower | 180 sec |

TABLE 9

|  | Sensitivity (mJ/cm²) | LER (nm) | Pattern Profile |
|---|---|---|---|
| Example 19 | 25 | 5.5 | A |
| Example 20 | 22 | 6 | A |
| Example 21 | 22 | 6 | A |

It is seen from the results in Table 9 that also in the case of using EUV light (wavelength: 13 nm), the resist pattern forming method according to the present invention can satisfy high sensitivity, small line edge roughness (LER) and excellent pattern profile all at the same time.

According to the present invention, a resist pattern forming method capable of forming a pattern satisfying high resolution performance (for example, high resolution and small line edge roughness (LER)) enabling resolution of an ultrafine (for example, a 1:1 line-and-space with a line width of 30 nm or less) pattern, excellent pattern profile and high sensitivity all at the same time, a resist pattern, a positive resist composition, a nanoimprint mold and a photomask can be provided.

This application is based on Japanese patent application JP 2011-180894, filed on Aug. 22, 2011, the entire content of which is hereby incorporated by reference, the same as if set forth at length.

What is claimed is:

1. A resist pattern forming method, comprising: in the following order,
   (1) a step of forming a film on a substrate by using a positive resist composition;
   (2) a step of exposing the film; and
   (4) a step of performing development by using an alkali developer after the exposing, wherein
   the positive resist composition contains (A) a polymer compound having a repeating unit represented by the following formula (I),
   a thickness of the film formed in the step (1) is from 15 to 40 nm, and
   an alkali component concentration in the alkali developer is from 0.5 to 1.1 mass %:

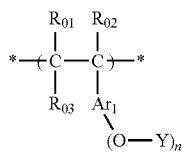

(I)

wherein each of $R_{01}$, $R_{02}$ and $R_{03}$ independently represents a hydrogen atom, an alkyl group, a cycloalkyl group, a halogen atom, a cyano group or an alkoxycarbonyl group, $R_{03}$ and $Ar_1$ may combine to form a 5- or 6-membered ring and in this case, $R_{03}$ represents an alkylene group;

$Ar_1$ represents an (n+1)-valent aromatic ring group and in the case of combining with $R_{03}$ to form a ring, represents an (n+2)-valent aromatic ring group;

n represents an integer of 1 to 4; and each of n number of Y's independently represents a group capable of leaving by an action of an acid, said group being a structure represented by formula (II):

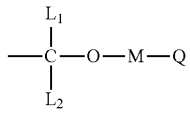

(II)

wherein in formula (II), each of $L_1$ and $L_2$ independently represents a hydrogen atom, an alkyl group, a cycloalkyl group, an aryl group or an aralkyl group;

M represents a single bond or a divalent linking group;

Q represents an alkyl group, a cycloalkyl group, an alicyclic group, an aromatic ring group, an amino group, an ammonium group, a mercapto group, a cyano group or an aldehyde group, provided that the alicyclic group and the aromatic ring group may contain a heteroatom; and at least two members of Q, M and $L_1$ may combine with each other to form a 5- or 6-membered ring.

2. The resist pattern forming method according to claim 1, wherein in the development step (4), the development is performed by continuously supplying a substantially fresh alkali developer.

3. The resist pattern forming method according to claim 1, wherein the alkali developer used in the development step (4) is an aqueous solution containing tetramethylammonium hydroxide.

4. The resist pattern forming method according to claim 1, further comprising:
   (3) a baking step between the exposure step (2) and the development step (4).

5. The resist pattern forming method according to claim 1, wherein the exposing in the exposure step (2) is performed by an electron beam or EUV light.

6. The resist pattern forming method according to claim 1, wherein the positive resist composition used in the film forming step (1) further contains (B) a compound capable of generating an acid upon irradiation with an actinic ray or radiation and (C) a basic compound.

7. A resist pattern, which is formed by the resist pattern forming method according to claim 1.

8. The resist pattern forming method according to claim 1, wherein the thickness of the film formed is 15 to 35 nm.

9. The resist pattern forming method according to claim 1, wherein the alkali component concentration in the alkali developer is 0.6 to 1.0 mass %.

10. The resist pattern forming method according to claim 1, wherein the resist pattern forming method further includes a step of stopping the development while replacing the developer with pure water after the development.

11. The resist pattern forming method according to claim 1, wherein the group represented by -(M-Q) in the formula (II) is a group having a carbon number of 5 to 20.

12. The resist pattern forming method according to claim 1, wherein the polymer compound (A) contains a repeating unit represented by the following formula (V):

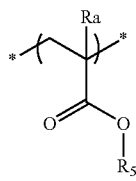

(V)

wherein in formula (V), Ra represents a hydrogen atom, an alkyl group, or a —$CH_2$—O—$Ra_2$ group, wherein $Ra_2$ represents a hydrogen atom, an alkyl group or an acyl group, and the alkyl group as Ra and $Ra_2$ may further have a substituent; and $R_5$ represents a lactone group.

13. The resist pattern forming method according to claim 1, wherein the polymer compound (A) contains a repeating unit having, in a side chain, a group capable of generating an acid upon irradiation with an actinic ray or radiation.

14. The resist pattern forming method according to claim 1, wherein the mass average molecular weight of the polymer compound (A) is 1,000 to 8,000.

15. The resist pattern forming method according to claim 1, wherein the mass average molecular weight of the polymer compound (A) is 2,000 to 6,000.

* * * * *